(12) United States Patent
Matsumoto

(10) Patent No.: US 11,302,521 B2
(45) Date of Patent: Apr. 12, 2022

(54) PROCESSING SYSTEM AND PROCESSING METHOD

(71) Applicant: TOKYO ELECTRON LIMITED, Tokyo (JP)

(72) Inventor: Kenji Matsumoto, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 97 days.

(21) Appl. No.: 16/388,439

(22) Filed: Apr. 18, 2019

(65) Prior Publication Data

US 2019/0326105 A1 Oct. 24, 2019

(30) Foreign Application Priority Data

Apr. 18, 2018 (JP) .............................. JP2018-080034
Aug. 2, 2018 (JP) .............................. JP2018-146076

(51) Int. Cl.
*C23C 16/02* (2006.01)
*C23C 16/50* (2006.01)
(Continued)

(52) U.S. Cl.
CPC .... *H01J 37/32733* (2013.01); *C23C 16/0245* (2013.01); *C23C 16/4408* (2013.01);
(Continued)

(58) Field of Classification Search
CPC . C23C 16/0245; C23C 16/50; C23C 16/4408; H01J 37/32733; H01J 37/3211;
(Continued)

(56) References Cited

U.S. PATENT DOCUMENTS 6,346,489 B1    2/2002   Cohen et al.
8,551,289 B2   10/2013   Nishimura et al.
(Continued)

FOREIGN PATENT DOCUMENTS

JP    2001-085331 A    3/2001
JP    2001-203194 A    7/2001
(Continued)

*Primary Examiner* — Dah-Wei D. Yuan
*Assistant Examiner* — Nga Leung V Law
(74) *Attorney, Agent, or Firm* — Weihrouch IP

(57) ABSTRACT

A plasma processing system includes processing modules, a transfer device connected to the processing modules, and a control unit for controlling an oxygen partial pressure and a water vapor partial pressure in the transfer device. The control unit controls the oxygen partial pressure and the water vapor partial pressure in the transfer device to 127 Pa or less and 24.1 Pa or less, respectively. The processing modules include a first processing module for performing etching on the target object, a second processing module for performing surface treatment on the target object, and a third processing module for performing a deposition process on the target object. The second processing module performs the surface treatment using hydrogen radicals generated by a high frequency antenna. The high frequency antenna resonates at one half of a wavelength of a signal supplied from a high frequency power supply used in the processing system.

6 Claims, 16 Drawing Sheets

(51) Int. Cl.
*C23C 16/44* (2006.01)
*H01J 37/32* (2006.01)
*H01L 21/67* (2006.01)

(52) U.S. Cl.
CPC .......... *C23C 16/50* (2013.01); *H01J 37/3211* (2013.01); *H01J 37/32449* (2013.01); *H01J 37/32816* (2013.01); *H01L 21/67017* (2013.01); *H01L 21/67155* (2013.01); *H01J 2237/182* (2013.01); *H01J 2237/335* (2013.01)

(58) Field of Classification Search
CPC ........... H01J 37/32816; H01J 37/32449; H01J 2237/335; H01J 2237/182; H01L 21/67017; H01L 21/67155; H01L 21/67745
See application file for complete search history.

(56) References Cited

U.S. PATENT DOCUMENTS

| | | | |
|---|---|---|---|
| 2006/0154486 A1* | 7/2006 | Balasubramaniam | H01J 37/32082 438/706 |
| 2007/0292615 A1 | 12/2007 | Dordi et al. | |
| 2008/0053957 A1 | 3/2008 | Wakabayashi | |
| 2008/0057728 A1 | 3/2008 | Shimura et al. | |
| 2008/0132078 A1* | 6/2008 | Yamazaki | G03F 7/427 438/710 |
| 2008/0146036 A1* | 6/2008 | Lai | H01L 21/31144 438/710 |
| 2008/0233766 A1 | 9/2008 | Tahara et al. | |
| 2008/0261405 A1 | 10/2008 | Yang et al. | |
| 2009/0011605 A1 | 1/2009 | Chiba et al. | |
| 2009/0014414 A1 | 1/2009 | Tomioka et al. | |
| 2009/0093080 A1* | 4/2009 | Choi | C23C 16/4408 438/73 |
| 2009/0179003 A1 | 7/2009 | Nishimura | |
| 2010/0323501 A1* | 12/2010 | Yamazaki | H01J 37/3244 438/479 |
| 2012/0270406 A1* | 10/2012 | Tahara | H01J 37/32853 438/710 |
| 2013/0302115 A1 | 11/2013 | Wakabayashi et al. | |
| 2014/0287588 A1* | 9/2014 | Takahashi | C23C 16/0227 438/694 |
| 2015/0021775 A1* | 1/2015 | Matsumoto | C23C 16/401 257/751 |
| 2016/0276218 A1 | 9/2016 | Matsumoto et al. | |
| 2018/0012844 A1 | 1/2018 | Ishizaka et al. | |

FOREIGN PATENT DOCUMENTS

| | | |
|---|---|---|
| JP | 2002-500276 A | 1/2002 |
| JP | 2005-504885 A | 2/2005 |
| JP | 2006-049798 A | 2/2006 |
| JP | 2006-073722 A | 3/2006 |
| JP | 2007-533139 A | 11/2007 |
| JP | 2008-053550 A | 3/2008 |
| JP | 2008-098418 A | 4/2008 |
| JP | 2008-527711 A | 7/2008 |
| JP | 2008-235660 A | 10/2008 |
| JP | 2008-277812 A | 11/2008 |
| JP | 2008-300568 A | 12/2008 |
| JP | 2009-016447 A | 1/2009 |
| JP | 2009-224808 A | 1/2009 |
| JP | 2009-170547 A | 7/2009 |
| JP | 2010-503203 A | 1/2010 |
| JP | 2010-503204 A | 1/2010 |
| JP | 2010-503205 A | 1/2010 |
| JP | 2010-503210 A | 1/2010 |
| JP | 2010-258324 A | 11/2010 |
| JP | 2014-099627 A | 5/2014 |
| JP | 2016-0174141 A | 1/2016 |
| JP | 2018-014477 A | 1/2018 |
| WO | 99/34424 A1 | 7/1999 |
| WO | 03/030224 A2 | 4/2003 |
| WO | 2005/101100 A2 | 10/2005 |
| WO | 2006/076085 A2 | 7/2006 |
| WO | 2008/027205 A2 | 3/2008 |
| WO | 2008/027214 A2 | 3/2008 |
| WO | 2008/027386 A2 | 3/2008 |
| WO | 2012/098871 A1 | 7/2012 |
| WO | 2013/153777 A1 | 10/2013 |

\* cited by examiner

PROCESSING SYSTEM AND PROCESSING METHOD

CROSS-REFERENCE TO RELATED APPLICATIONS

This application claims priority to Japanese Patent Application No. 2018-080034 filed on Apr. 18, 2018 and Japanese Patent Application No. 2018-146076 filed on Aug. 2, 2018, the entire contents of which are incorporated herein by reference.

TECHNICAL FIELD

The present disclosure relates to a processing system and a processing method.

BACKGROUND

In manufacturing semiconductor devices, different processing apparatuses can be used for etching, film formation, and the like (see Japanese Patent Application Publication Nos. 2006-049798, 2009-170547, 2016-174141, 2008-053550, and 2010-503210, International Publication No. 2012/098871 pamphlet, and Japanese Patent Application Publication Nos. 2014-099627, 2010-503205, 2010-503204. 2010-503203, 2007-533139, and 2018-014477). For example, when an apparatus used for etching and an apparatus used for film formation are different, a processing system for transferring a semiconductor wafer as a target object between the apparatuses depending on types of processing is used. Further, in manufacturing semiconductor devices, a surface of an etched wafer may be cleaned. Particularly, residues such as polymers containing fluorine (F) and the like remain on the surface of the etched wafer, and it is general that a next process is performed on the wafer after the residues are removed by a wet cleaning process.

As a cleaning process, a reduction asking process using plasma of hydrogen that is a dry process may be used (see Japanese Patent Application Publication Nos. 2009-016447, 2008-235660, 2008-098418, 2008-527711, 2008-277812, 2001-203194, and 2006-073722).

SUMMARY

In one exemplary embodiment, a processing system is provided. The plasma processing system for processing a target object includes a plurality of processing modules configured to process the target object, a transfer device connected to the processing modules, and a control unit configured to control an oxygen partial pressure and a water vapor partial pressure in the transfer device. The control unit controls the oxygen partial pressure in the transfer device to 127 Pa or less and the water vapor partial pressure in the transfer device to 24.1 Pa or less by using vacuum evacuation of a vacuum pump or inert gas substitution. The processing modules include a first processing module configured to perform etching on the target object, a second processing module configured to perform surface treatment on the target object, and a third processing module configured to perform a deposition process on the target object. The second processing module performs the surface treatment using hydrogen radicals generated by a high frequency antenna. The high frequency antenna is formed in a shape of a planar spiral coil for generating inductively coupled plasma, and an antenna element of the high frequency antenna is opened at both ends and grounded at a central portion, and resonates at a wavelength that is one half of a wavelength of a signal supplied from a high frequency power supply used in the processing system.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
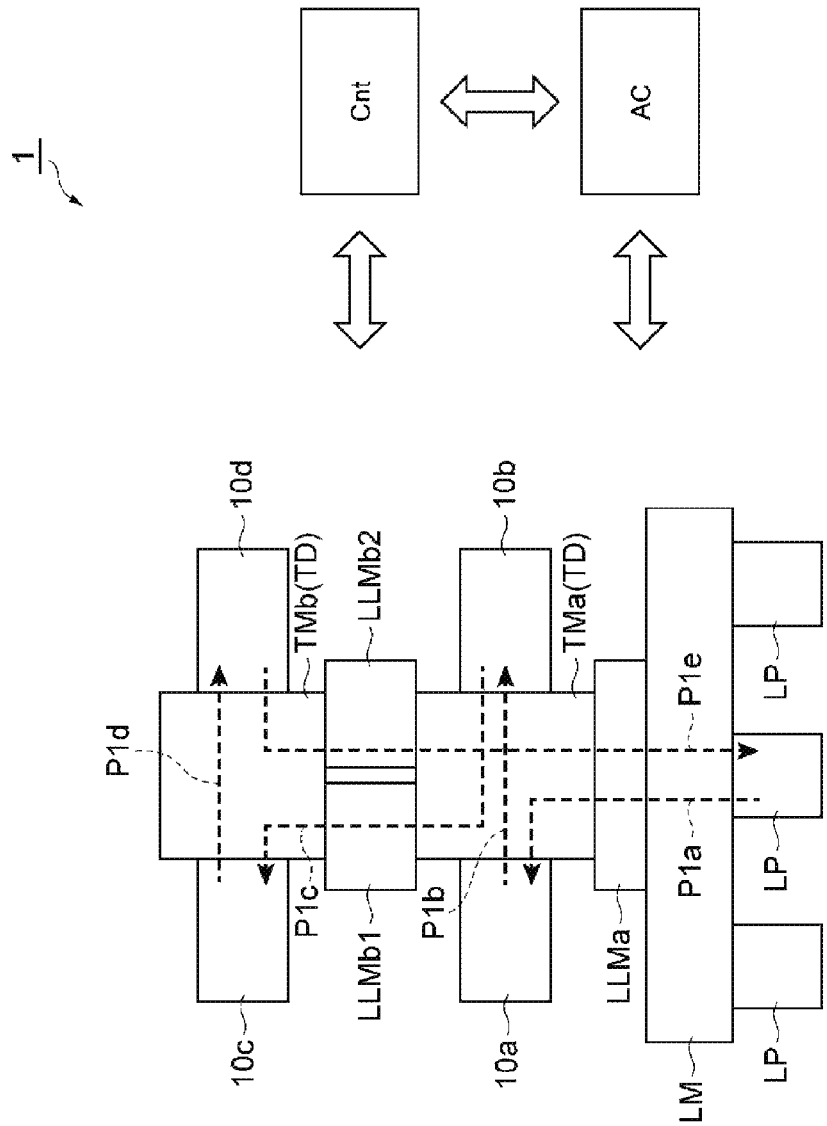
FIG. 1 schematically shows a configuration of a processing system according to a first embodiment as an exemplary embodiment.

When a wafer as a target object is transferred between apparatuses depending on types of processing, the wafer may be exposed to the atmosphere (particularly, oxygen and moisture). When the surface of the processed wafer is brought into contact with oxygen, moisture or the like in the atmosphere, various unexpected reactions may occur on the surface and the inside of the wafer. Due to such reactions, problems such as an increase in a resistance value, RC signal delay, deterioration in reliability, and the like may occur in the manufactured semiconductor devices. Therefore, there is provided a technique capable of avoiding various reactions that may occur on the surface and the inside of the target object by the exposure of the target object to the atmosphere. Hereinafter, various exemplary embodiments will be described.

In an aspect of the present disclosure, there is provided a processing system. The processing system is a processing system for processing a target object including: a plurality of processing modules configured to process the target object, a transfer device connected to the processing modules, and a control unit configured to control an oxygen partial pressure and a water vapor partial pressure in the transfer device. The control unit controls the oxygen partial pressure in the transfer device to 127 Pa or less and the water vapor partial pressure in the transfer device to 24.1 Pa or less by using vacuum evacuation of a vacuum pump or inert gas substitution. The processing modules include: a first processing module configured to perform etching on the target object, a second processing module configured to perform surface treatment on the target object, and a third processing module configured to perform a deposition process on the target object. The second processing module performs the surface treatment using hydrogen radicals generated by a high frequency antenna. The high frequency antenna is formed in a shape of a planar spiral coil for generating inductively coupled plasma. An antenna element of the high frequency antenna is opened at both ends and grounded at a central portion, and resonates at a wavelength that is one half of a wavelength of a signal supplied from a high frequency power supply used in the processing system. In the processing system, the oxygen partial pressure and the water vapor partial pressure in the transfer device is sufficiently reduced, thereby the etching process, the surface treatment, and the deposition process on the target object can be performed in a consistent vacuum environment.

Accordingly, substances that can be generated on the surface of the target object by the etching process performed in the first processing module can be removed, without being exposed to the atmosphere, by the surface treatment in a state where oxygen, water, and the like contained in the atmosphere are sufficiently reduced. Further, the deposition process can be performed on the surface of the target object without exposure to the atmosphere while maintaining the state in which oxygen, water, and the like are sufficiently reduced. Therefore, it is possible to sufficiently avoid unexpected reaction that may occur on the surface and the inside of the target object due to the action of oxygen, water, and the like contained in the atmosphere on the surface of the target object after the etching. Further, as a result of study, the inventor has discovered that it is possible to sufficiently avoid unexpected reaction that may occur on the surface and the inside of the target object due to the action of oxygen, water, and the like in the atmosphere on the surface of the target object after the etching by setting the oxygen partial pressure and the water vapor partial pressure to 127 Pa or less and 24.1 Pa or less, respectively. The oxygen partial pressure or the water vapor partial pressure around the target object may be controlled by using vacuum evacuation of a vacuum pump or gas substitution using inert gas. Further, in order to enhance the effect, the partial pressure may be controlled by using both the vacuum evacuation and the gas substitution. Further, a relatively large amount of hydrogen radicals can be generated by using the high frequency antenna having the above configuration.

In the processing system, the second processing module performs the surface treatment using hydrogen radicals to reduce a fluorine content on the surface of the target object to $1/10$ or less of a fluorine content before the execution of the surface treatment. The inventor has discovered that, by using hydrogen radicals, it is possible to effectively perform the surface treatment of the target object after the etching process.

In the processing system, the control unit drives the first processing module, the second processing module, and the third processing module, in that order.

In the processing system, the transfer device includes a first transfer module and a second transfer module. The control unit controls an oxygen partial pressure and a water vapor partial pressure in the second transfer module to be lower than an oxygen partial pressure and a water vapor partial pressure in the first transfer module. In this manner, even in the transfer device, two different atmospheric pressures can be set at the same time.

In the processing system, the third processing module is connected to the second transfer module. Further, the first processing module and the second processing module are connected to the first transfer module. In this way, the transfer of the target object to the third processing module is performed under the lowest atmospheric pressure in the transfer device.

In the processing system, the transfer device uses at least one or both of a purge gas and a cryopump to control the oxygen partial pressure and the water vapor partial pressure in each of the first transfer module and the second transfer module.

In the processing system, the purge gas includes an inert gas having an extremely low oxygen partial pressure that is generated in a yttria-stabilized zirconia tube.

In the processing system, the purge gas contains $H_2$ gas or CO gas.

In the processing system, the second processing module performs the surface treatment by controlling a pressure in the second processing module such that two different pressures are alternately repeated while supplying hydrogen radicals into the second processing module.

In the processing system, the second processing module repeats two processes alternately. One of the two processes is supplying hydrogen radicals into the second processing module at a first pressure. The other of the two processes is stopping the supply of hydrogen radicals into the second processing module and setting the pressure in the second processing module to a second pressure lower than the first pressure. The second processing module performs the surface treatment by alternately repeating the two processes.

In another aspect of the present disclosure, there is provided a processing method. The processing method is for processing a target object. The processing method includes a first step of performing etching on the target object, a second step of performing surface treatment on the target object, and a third step of performing a deposition process on the target object. In the processing method, the target object is not exposed to the atmosphere from the end of the first step to the start of the third step, and the oxygen partial pressure around the target object is adjusted to 127 Pa or less and the water vapor partial pressure around the target object is adjusted to 24.1 Pa or less by vacuum evacuation of a vacuum pump or by inert gas substitution. In the second step, the surface treatment is performed by using hydrogen radicals generated by a high frequency antenna. The high frequency antenna is formed in a shape of a planar spiral coil for generating an inductively coupled plasma. An antenna element of the high frequency antenna is opened at both ends and grounded at a central portion, and resonates at a wavelength that is one half of a wavelength of a signal supplied from a high frequency power supply used in the processing method. In the processing method, the oxygen partial pressure and the water vapor partial pressure from the end of the first step to the start of the third step is sufficiently reduced, thereby the etching process, the surface treatment, and the deposition process on the target object can be performed in a consistent vacuum environment.

Accordingly, substances that can be generated on the surface of the target object by the etching process performed in the first processing module can be removed, without being exposed to the atmosphere, by the surface treatment in a state where oxygen, water, and the like contained in the atmosphere are sufficiently reduced. Further, the deposition process can be performed on the surface of the target object without exposure to the atmosphere while maintaining the state in which oxygen, water, and the like are sufficiently reduced. Therefore, it is possible to sufficiently avoid unexpected reaction that may occur on the surface and the inside of the target object due to the action of oxygen, water, and the like contained in the atmosphere on the surface of the target object after the etching. Further, as a result of study, the inventor has discovered that it is possible to sufficiently avoid unexpected reaction that may occur on the surface and the inside of the target object due to the action of oxygen, water, and the like in the atmosphere on the surface of the target object after the etching by setting the oxygen partial pressure and the water vapor partial pressure to 127 Pa or less and 24.1 Pa or less, respectively. The oxygen partial pressure or the water vapor partial pressure around the target object may be controlled by using vacuum evacuation of a vacuum pump or gas substitution using inert gas. Further, in order to enhance the effect, the partial pressure may be controlled by using both of the vacuum evacuation and the gas substitution. Further, a relatively large amount of hydrogen radicals can be generated by using the high frequency antenna having the above configuration.

In the processing method, in the second step, the surface treatment using hydrogen radicals is performed to reduce a fluorine content on the surface of the target object to 1/10 or less of a fluorine content before the execution of the surface treatment. The inventor has discovered that, by using hydrogen radicals, it is possible to effectively perform the surface treatment of the target object after the etching process.

In the processing method, the first step, the second step, and the third step are executed in that order.

In the processing method, between the first step, the second step, and the third step, at least one or both of a purge gas and a cryopump is used to control the oxygen partial pressure and the water vapor pressure around the target object.

In the processing method, the purge gas includes an inert gas of an extremely low oxygen pressure which is generated in a yttria-stabilized zirconia tube.

In the processing method, the purge gas contains $H_2$ gas or CO gas.

In the processing method, in the second step, the surface treatment is performed by controlling a pressure around the target object such that two different pressures are alternately repeated while supplying hydrogen radicals to a vicinity of the target object.

In the processing method, in the second step, the surface treatment is performed by alternately repeating a process of supplying hydrogen radicals around the target object at a first pressure and a step of stopping the supply of hydrogen radicals to a vicinity of the target object and setting a pressure around the target object to a second pressure lower than the first pressure.

Hereinafter, various embodiments will be described in detail with reference to the drawings. Like reference numerals will be given to like or corresponding parts throughout the drawings.

A processing system 1 to be described later processes a target object (hereinafter, referred to as "wafer W"). A method MT to be described later is a processing method for processing the wafer W.

For example, the processing system 1 and the method MT are used in a process of forming a BEOL (Back End Of Line) wiring based on a dual damascene method, but may also be used in other processes.

Hereinafter, the processing system 1 and the method MT according to a first to a fourth embodiment will be described. The processing system 1 and the method MT according to each of the first to the fourth embodiment are used in the process of forming the BEOL wiring based on the dual damascene method.

Specifically, in each of the first to the fourth embodiment, first, an interlayer insulating film (Low-k film) is etched by using a pattern formed by a photolithography method to form a via hole and a wiring trench. Next, a barrier layer and the like are formed on the surface of the interlayer insulating film which is exposed by the etching and, then, each of the via hole and the wiring groove is filled with metal. In the case of an $SiO_x$-based interlayer insulating film (x being a positive number, hereinafter the same), a fluorocarbon-based gas can be used for etching the interlayer insulating film.

First Embodiment

Figure 2:
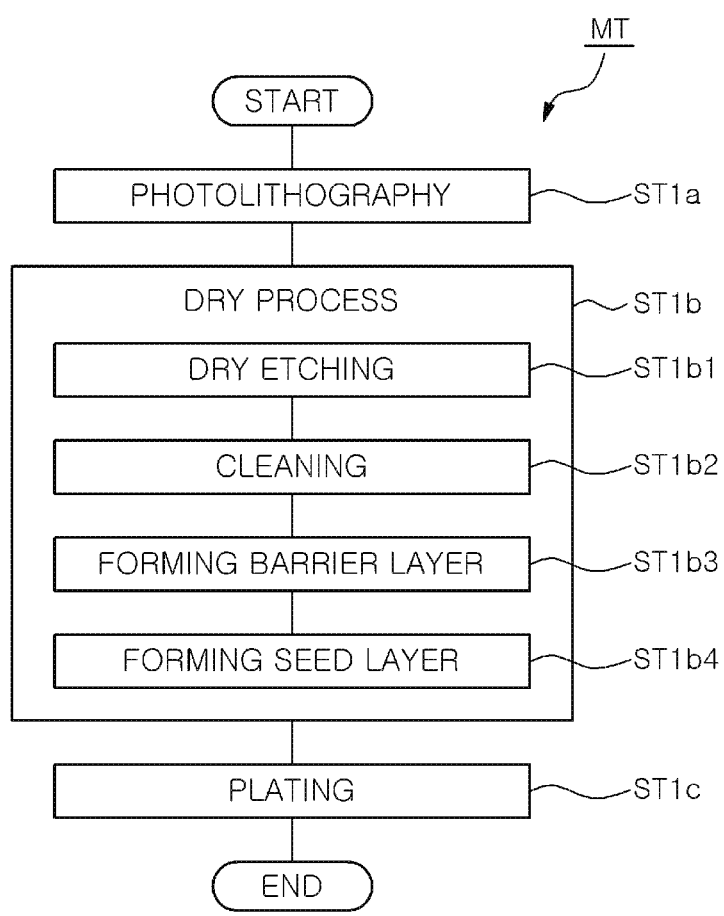
FIG. 2 is a flowchart of a processing method according to the first embodiment.

The first embodiment will be described with reference to FIG. 1 and FIG. 2. FIG. 1 schematically shows the configuration of the processing system 1 according to the first embodiment. FIG. 2 is a flowchart of a method MT according to the first embodiment. A part of the method MT shown in FIG. 2 can be performed by using the processing system 1 shown in FIG. 1.

The processing system 1 includes a plurality of accommodating containers LP, a loader module LM, a transfer device TD, an atmospheric pressure control system AC, a control unit Cnt, a plurality of processing modules 10a to 10d.

The transfer device TD is connected to the processing modules (processing module 10a and the like), and transfers a wafer W to each of the processing modules (processing modules 10a and the like). The transfer device TD includes a load-lock module LLMa, a transfer module TMa (first transfer module), load-lock modules LLMb1 and LLMb2, and a transfer module TMb (second transfer module).

The processing modules (processing module 10a and the like) individually process the wafer W. The space extending from the inside of the transfer device TD to the inside of each of the processing modules (processing modules 10a and the like) is hermetically sealed.

The control unit Cnt is a computer including a processor, a storage unit, an input device, a display device, and the like, and integrally controls the respective components of the processing system 1 shown in FIG. 1. The control unit Cnt operates in response to a computer program (program based on an input recipe) for controlling the respective components of the processing system 1 shown in FIG. 1 in each step of the method MT shown in the flowchart of FIG. 2, and outputs a control signal. The control unit Cnt executes a part of the method MT shown in the flowchart of FIG. 2 by controlling the respective components of the processing system 1 shown in FIG. 1 with the control signal. The computer program for executing a part of the method MT shown in the flowchart of FIG. 2 and various data used for executing a part of the method MT are readably stored in the storage unit of the control unit Cnt.

The control unit Cnt controls the atmospheric pressure in the space extending from the inside of the transfer device TD to the inside of each of the processing modules (processing modules 10a and the like). During the execution of the method MT, the control unit Cnt controls the atmospheric pressure in the space extending from the inside of the transfer device TD to the inside of each of the processing modules (processing modules 10a and the like) to a pressure lower than the atmospheric pressure, e.g., 600 Pa or less, and controls the internal pressure (oxygen partial pressure and water vapor partial pressure) of the transfer module TMb to be lower than that of the transfer module TMa, e.g., 600 Pa to 1 Pa. The internal pressure of each of the transfer modules TMa and TMb indicates the oxygen partial pressure and the water vapor partial pressure.

In the present disclosure, the transfer module TMa includes a dry pump and a mechanical booster pump. The ultimate vacuum level in the transfer module TMa may be, e.g., about 5 Pa. The transfer module TMb includes a dry pump, a mechanical booster pump, and a turbo molecular pump. The ultimate vacuum level in the transfer module TMb may be, e.g., 5E-4 (=5/10000) Pa. A relatively high cost is required to set a pressure in the entire transfer device TD to a relatively high vacuum state. Therefore, the transfer device TD is divided into the transfer modules TMa and TMb and different pump configurations are provided to reduce the cost and obtain a desired minimum vacuum level. Since the internal pressure of the transfer module TMa and the internal pressure of the transfer module TMb are different from each other, the oxygen partial pressure or the water vapor partial pressure in each of the transfer modules TMa and TMb are also different from each other depending on the internal pressures thereof. More specifically, the internal pressure, the oxygen partial pressure, and the vapor partial pressure in the transfer module TMb are lower than those in the transfer module TMa.

The control unit Cnt controls the oxygen partial pressure in the space extending from the inside of the transfer device TD to the inside of each of the processing modules (processing modules 10a and the like) to 127 Pa or less during the execution of the method MT. The control unit Cnt controls the oxygen partial pressure in the transfer device TD to at least 127 Pa or less. The control unit Cnt controls the water vapor partial pressure in the space extending from the inside of the TD to the inside of each of the processing modules (processing modules 10a and the like) to 24.1 Pa or less during the execution of the method MT. The control unit Cnt controls the water vapor partial pressure in the transfer device TD to at least 24.1 Pa or less.

The control unit Cnt uses vacuum evacuation of a vacuum pump (not shown) of the atmospheric pressure control system AC or inert gas substitution of a gas supply system (not shown) of the atmospheric pressure adjustment system AC. The control unit Cnt controls the oxygen partial pressure or the water vapor partial pressure in the space extending from the inside of the transfer device TD to the inside of each of the processing modules (the processing modules 10a and the like) by the vacuum evacuation or the gas substitution.

The atmospheric pressure control system AC measures the pressures in the inner spaces of the transfer device TD, the processing modules (processing modules 10a and the like), and the like and transmits the measurement results to the control unit Cnt. The control unit Cnt controls the pressures in the inner spaces of the transfer device TD, the processing modules (processing modules 10a and the like), and the like based on the measurement results related to the pressure transmitted from the atmospheric pressure control system AC.

The accommodating containers LP are arranged along one edge of the loader module LM, and each accommodating container LP can accommodate a wafer W.

A transfer robot (not shown) is provided in the loader module LM. The transfer robot in the loader module LM takes out the wafer W accommodated in the accommodating container LP and transfers the wafer W to the load-lock module LLMa.

The load-lock module LLMa is provided along another edge of the loader module LM and is connected to the loader module LM. The load-lock module LLMa constitutes a preliminary decompression chamber. The load-lock module LLMa is connected to the transfer module TMa.

The transfer module TMa is connected to the load-lock module LLMa, the processing module 10a, the processing module 10b, and the load-lock modules LLMb1 and LLMb2. The transfer module TMa is a depressurizable chamber, a transfer robot (not shown) is provided in the transfer module TMa. The transfer robot in the transfer module TMa can transfer the wafer W via the transfer module TMa. The wafer W can be transferred by the transfer robot between the load-lock module LLMa, the processing module 10a, the processing module 10b, the load-lock module LLMb1, and the load-lock module LLMb2.

The load-lock modules LLMb1 and LLMb2 have the same configuration. The load-lock modules LLMb1 and LLMb2 are connected to the transfer modules TMa and TMb. When the wafer W is provided in the load-lock module LLMb1 or LLMb2, the load-lock module LLMb1 or LLMb2 can control (cool or heat) the temperature of the wafer W.

The transfer module TMb is connected to the load-lock modules LLMb1 and LLMb2, and the processing modules 10c and 10d. The transfer module TMb is a depressurizable chamber, and a transfer robot (not shown) is provided in the transfer module TMb. The transfer robot in the transfer module TMb can transfer the wafer W via the transfer module TMb. The wafer W can be transferred between the load-lock modules LLMb1 and LLMb2, and the processing modules 10c and 10d.

In both of the transfer module TMa and the transfer module TMb, the oxygen partial pressure and the water vapor partial pressure required to extend Q-time of one hour to one week are respectively, e.g., 127 Pa or less and 24.1 Pa or less. The Q-time of one hour is a period of time from the end of one process to the start of a next process.

In the processing system 1, the wafer W is transferred in the order of paths P1a to P1e shown in FIG. 1 by the method MT.

The processing module 10a (first processing module) performs etching on the wafer W. More specifically, the processing module 10a is a plasma processing apparatus that can performs RIE (Reactive Ion Etching) on the wafer W. The RIE performed by the processing module 10a is a dry process. In the RIE performed by the processing module 10a, plasma of a gaseous mixture of a CF-based gas (gas containing C and F, e.g., $C_4F_8$ gas, $C_5F_8$ gas, $C_4F_6$ gas, or the like) and a CHF-based gas (gas containing C, H and F, e.g., $CHF_3$ gas, $CH_2F_2$ gas or the like) can be used. Accordingly, the interlayer insulating film made of the silicon oxide film is etched. Then, removal (ashing) of a carbon-containing film such as a photoresist film used as an etching mask or the like can be performed. In that case, plasma of a gaseous mixture containing an O-based gas (gas containing O, e.g., $O_2$ gas, CO gas, $CO_2$ gas, or the like) can be used. The ashing performed by the processing module 10a is a dry process.

The processing module 10b (second processing module) performs surface treatment on the wafer W by using hydrogen radicals. More specifically, the processing module 10b is a plasma processing apparatus that can perform a cleaning process using hydrogen radicals on the wafer W. The cleaning process performed by the processing module 10b is a dry process. The processing module 10b generates hydrogen radicals used for the surface treatment by using at least one of ICP, CCP, remote plasma and hot filament. ICP is inductively coupled plasma, and CCP is capacitively coupled plasma. The processing module 10b performs the surface treatment using the hydrogen radicals, so that a fluorine content on the surface of the wafer W is reduced to 1/10 or less of a fluorine content on the surface of the wafer W before the execution of the surface treatment.

The processing module 10c (third processing module) performs a deposition process on the wafer W. More specifically, the processing module 10c is a plasma processing apparatus that can form a barrier layer on the wafer W by an ionized PVD (Physical Vapor Deposition) method. The barrier layer formation performed by the processing module 10c is a dry process. The processing module 10c can form a Ta/TaN barrier layer.

The processing module 10d (third processing module) performs a deposition process on the wafer W. More specifically, the processing module 10d is a plasma processing apparatus that can form a seed layer on the wafer W by the ionized PVD method. The seed layer formation performed by the processing module 10d is a dry process. The processing module 10d can form a Cu seed layer.

The control unit Cnt drives the processing modules 10a to 10d in that order.

The processing modules 10a and 10b are connected to the transfer module TMa. The processing modules 10c and 10d are connected to the transfer module TMb.

A part of the method MT shown in FIG. 2 is performed by using the processing system 1 shown in FIG. 1. The method MT includes steps ST1a, ST1b, and ST1c. The step ST1b includes a step ST1b1 (first step), a step ST1b2 (second step), a step ST1b3 (third step), and a step ST1b4 (third step). The step ST1b is executed in the processing system 1 shown in FIG. 1. In the step ST1b of the method MT, the steps ST1b1, ST1b2, ST1b3, and ST1b4 are executed in that order. More specifically, in the step ST1b, the step ST1b1 is executed first. Then, the step ST1b2 is executed. Then, the step ST1b3 is executed. Then, the step ST1b4 is executed. The wafer W is not exposed to the outside of the processing system 1 during the execution of the step ST1b, and thus is not exposed to the atmosphere.

More specifically, in the step ST1a, a pattern for forming a via hole and a wiring trench is formed by photolithography in order to perform a dual damascene method. In the step ST1a, a processing system different from the processing system 1 may be used.

After the step ST1a, the wafer W is transferred to the processing system 1. In the processing system 1, the step ST1b subsequent to the step ST1a is executed. In the step ST1b, only a dry process is performed in the processing system 1 under a consistent vacuum environment. The step ST1b includes the steps ST1b1 to ST1b4.

The wafer W transferred to the processing system 1 is transferred to the processing module 10a via the accommodating container LP, the loader module LM, the load-lock module LLMa, and the transfer module TMa in that order along the path P1a. The wafer W transferred to the processing module 10a is subjected to the step ST1b1 by the processing module 10a.

In the step ST1b1 (first step), the wafer W is etched. More specifically, in the step ST1b1, the processing module 10a etches an interlayer insulating film (mainly a silicon oxide film) of the wafer W based on the pattern formed in the step ST1a by the RIE method. In the etching process of step ST1b1, plasma of a CF-based gas (gas containing C and F, e.g., $C_4F_8$ gas, $C_5F_8$ gas, $C_4F_6$ gas, or the like) or a CHF-based gas (gas containing C, H, and F, e.g., $CHF_3$ gas, $CH_2F_2$ gas, or the like) can be used. Then, removal (asking) of the carbon-containing film such as a photoresist film used as an etching mask can be performed. In that case, plasma of a gaseous mixture containing an O-based gas (gas containing O, e.g., $O_2$ gas, CO gas, $CO_2$ gas, or the like) can be used. Alternately, plasma of a gaseous mixture of a CF-based gas and a CHF-based gas may be used depending on types of the etching target film and the mask and a required etching selectivity.

The wafer W that has been subjected to the etching process in the step ST1b1 is transferred from the processing module 10a to the processing module 10b via the transfer module TMa in a vacuum state along the path P1b.

The wafer W is transferred from the processing module 10a to the processing module 10b via the transfer module TMa in a vacuum state in a consistent vacuum environment without being exposed to the atmosphere. The wafer W transferred to the processing module 10b is subjected to the step ST1b2 by the processing module 10b.

In the step ST1b2 (second step), surface treatment is performed on the wafer W. In the step ST1b2, the surface treatment is performed on the wafer W by using hydrogen radicals. More specifically, in the step ST1b2, the processing module 10b cleans the surface of the wafer W by performing ashing using hydrogen radicals on the wafer W. In that case, the ashing is reduction ashing using hydrogen different from oxidation ashing using an O-based gas which can be performed in the step ST1b1. By performing the ashing of the step ST1b2, it is possible to sufficiently remove fluorine, CF-based polymers or the like remaining on the surface of the wafer W after the etching process in the step ST1b1. The step ST1b2 in the processing module 10b is a degas process. By heating the wafer W, moisture near the surface of the wafer W can be removed. In the step ST1b2, hydrogen radicals used for surface treatment are generated by using at least one of inductively coupled plasma, capacitively coupled plasma, remote plasma and hot filament. In the step ST1b2, the surface treatment using hydrogen radicals is performed, so that the fluorine content on the surface of the wafer W is reduced to 1/10 or less of the fluorine content on the surface of the wafer W before the execution of the surface treatment.

The wafer W that has been subjected to the cleaning process in the step ST1b2 is transferred to the processing module 10c along the path P1c. In that case, the wafer W is transferred from the processing module 10b to the processing module 10c via the transfer module TMa in a vacuum state, the load-lock module LLMb1 in a vacuum state, and the transfer module TMb in a vacuum state in that order.

The wafer W is transferred from the processing module 10b to the processing module 10c in a consistent vacuum environment without being exposed to the atmosphere. The wafer W is transferred via the transfer module TMa in a vacuum state, the load-lock module LLMb1 in a vacuum state, and the transfer module TMb in a vacuum state in that order. In the load-lock module LLMb1, the temperature of the wafer W that has been heated during the cleaning process can be decreased by decreasing the temperature of the mounting table on which the wafer W is mounted in advance. The temperature of the wafer W during the cleaning process in the step ST1$b$2 is about 300° C., whereas the temperature of the wafer W during the barrier layer formation in the step ST1$b$3 is about a room temperature. Since the difference between the temperature during the execution of the step ST1$b$2 and the temperature during the execution of the step ST1$b$3 is relatively large, it is preferable to perform cooling in the load-lock module LLMb1. The wafer W transferred to the processing module 10$c$ is subjected to the step ST1$b$3 by the processing module 10$c$.

In the step ST1$b$3 (third step), a deposition process is performed on the wafer W. More specifically, in the step ST1$b$3, the processing module 10$c$ forms a Ta/TaN barrier layer on the wafer W by using an ionized PVD method.

The wafer W that has been subjected to the barrier layer formation in the step ST1$b$3 is transferred from the processing module 10$c$ to the processing module 10$d$ via the transfer module TMb in a vacuum state along the path P1$d$.

The wafer W is transferred from the processing module 10$c$ to the processing module 10$d$ in a consistent vacuum environment via the transfer module TMb in a vacuum state without being exposed to the atmosphere. The wafer W transferred to the processing module 10$d$ is subjected to the step ST1$b$4 by the processing module 10$d$.

In the step ST1$b$4 (third step), a deposition process is performed on the wafer W. More specifically, in the step ST1$b$4, the processing module 10$d$ forms a Cu seed layer on the wafer W by using an ionized PVD method.

In the method MT, the wafer W is not exposed to the atmosphere from the start of the etching process to the end of the deposition process, and the pressure around the wafer W is set to be lower than the atmospheric pressure.

The oxygen partial pressure around the wafer W is 127 Pa or less from the start of the etching process to the end of the deposition process. The water vapor partial pressure around the wafer W is 24.1 Pa or less from the start of the etching process to the end of the deposition process.

The oxygen partial pressure or the water vapor partial pressure around the target object is controlled from the start of the etching process to the end of the deposition process by using vacuum evacuation of a vacuum pump or gas substitution using inert gas. The partial pressure can be controlled by using both of the vacuum evacuation and the gas substitution. As for the inert gas, a rare gas such as Ar gas or $N_2$ gas can be used.

Upon completion of the step ST1$b$4, in the processing system 1, the wafer W is transferred to the accommodating container LP along the path Pie. In that case, the wafer W is transferred from the processing module 10$d$ to the accommodating container LP via the transfer module TMb, the load-lock module LLMb2, the transfer module TMa, the load-lock module LLMa, and the loader module LM in that order. Thereafter, the wafer W is transferred to another processing system, and the step ST1$c$ is executed.

Upon completion of the step ST1$b$4, i.e., in the step ST1$c$ subsequent to the step ST1$b$, Cu is electrolytically plated, whereby the via hole and the wiring groove of the wafer W are filled with Cu. The step ST1$c$ can be executed in a processing system different from the processing system 1 shown in FIG. 1. In that case, the wafer W is unloaded from the processing system 1 shown in FIG. 1 to the outside after the step ST1$b$, and then loaded into the processing system different from the processing system 1 shown in FIG. 1.

In the first embodiment, the wafer W is not exposed to the atmosphere at least from the end of the first step to the start of the third step, and the pressure around the wafer W is set to be lower than the atmospheric pressure. The oxygen partial pressure around the target object is 127 Pa or less at least from the end of the first step to the start of the third step. The water vapor partial pressure around the wafer W is 24.1 Pa or less at least from the end of the first step to the start of the third step. The oxygen partial pressure or the water vapor partial pressure around the wafer W is controlled by using vacuum evacuation of a vacuum pump or gas substitution using inert gas at least from the end of the first step to the start of the third step. This is also applied to the second to the fourth embodiment to be described later.

In the processing system 1, the internal pressure of the transfer device TD can be controlled to a pressure lower than the atmospheric pressure. In a state where the pressure in the transfer device TD is sufficiently reduced, the etching process, the surface treatment, and the deposition process can be performed in a consistent vacuum environment. In other words, in the method MT, the wafer W is not exposed to the atmosphere from the end of the etching process to the start of the deposition process, and the pressure around the wafer W is set to be lower than the atmospheric pressure. Therefore, in a state where the pressure around the wafer W is sufficiently reduced, the etching process, the surface treatment, and the deposition process can be performed on the wafer W in a consistent vacuum environment. Accordingly, substances that can be generated on the surface of the wafer W by the etching process can be removed, without being exposed to the atmosphere, by the surface treatment in a state where oxygen, water, and the like contained in the atmosphere are sufficiently reduced. Further, the deposition process can be performed on the surface of the wafer W without exposure to the atmosphere while maintaining the state in which oxygen, water, and the like are sufficiently reduced. Therefore, it is possible to sufficiently avoid unexpected reaction that may occur on the surface and the inside of the wafer W due to the action of oxygen, water, and the like contained in the atmosphere on the surface of the wafer W after the etching. The above-described configuration of the processing system 1 is based on the fact that water and fluorine cause a phenomenon that may occur on the wafer W due to the exposure to the atmosphere and the influence of the phenomenon can be reduced by removing any one of water and fluorine. Conventionally, most of fluorine was removed by wet cleaning. However, the influence of oxygen and water was not eliminated due to the exposure to the atmosphere and wet treatment. The dry process of the present disclosure makes it possible to avoid an increase in a k value or corrosion of copper wiring by preventing the exposure to the atmosphere (i.e., by eliminating the influence of oxygen and water).

Specifically, in the process of forming the BEOL wiring based on the dual damascene method, if the interlayer insulating film of the wafer W is an $SiO_x$-based Low-k film, the interlayer insulating film is etched by using a fluorocarbon-based gas. In that case, residues of F (fluorine)-containing polymer may be generated on the surface of the wafer W after the etching. Here, the fluorocarbon-based gas is a CF-based gas or a CHF-based gas. Further, Si—$CH_3$ bonds are decreased and Si—OH bonds and Si—H bonds are increased in the low-k film by the etching and the oxidation ashing, so that water repellency on the surface of the wafer W can be reduce (i.e., the surface of the wafer W becomes hydrophilic). Therefore, if the wafer W is exposed to the atmosphere after the etching and the oxidation ashing, moisture absorption occurs on the surface of the wafer W due to oxygen, water, and the like in the atmosphere, residues of F-containing polymer on the surface of the wafer W, and the reduced water repellency. Further, the removal of the polymer is hindered, an underlying metal wiring (e.g., Cu) exposed at the bottom of the via after the etching is oxidized and corroded. In addition, an F-containing non-conductive film (e.g., $CuF_2$ or the like) can be formed. Since the k-value of water is about 80 at a room temperature, the progression of moisture absorption leads to an increase in the k-value, which may result in an increase in the capacity of the metal wiring. The residue of F-containing polymer becomes a supply source of F and may hinder adhesion between the interlayer insulating film and the barrier film. The oxidation/corrosion of the metal wiring and the formation of the non-conductive film containing F leads to an increase in a via resistance, which may cause RC delay and deterioration in reliability. In addition, strict Q-time management may be required in view of a product yield. In accordance with the processing system 1 and the method MT, the etching, the surface treatment, and the deposition can be performed on the wafer W in a consistent vacuum environment and, thus, the contact between the surface of the wafer W and oxygen, water, and the like in the atmosphere can be sufficiently suppressed without exposure to the atmosphere. Further, by performing the surface treatment that is a dry process on the etched wafer W, most of the residues of fluorocarbon-based polymer containing F (fluorine) generated on the surface of the wafer W by etching can be converted to hydrocarbon or HF and removed. The surface treatment is a cleaning process using reduction asking. In that case, reaction, e.g., $CF_4+8H \rightarrow CH_4+4HF$, may occur. Therefore, it is possible to sufficiently avoid various unexpected reactions that may occur on the surface and the inside of the wafer W by the action of oxygen, water, and the like in the atmosphere on the surface of the wafer W after the etching. Accordingly, the product yield can be improved and the management of Q-time can be relaxed.

As a result of study, the inventor has discovered that it is possible to sufficiently avoid an unexpected reaction that may occur on the surface and the inside of the wafer W by setting the oxygen partial pressure and the water vapor partial pressure to 127 Pa or less and 24.1 Pa or less, respectively. The unexpected reaction occurs due to the action of oxygen, water, and the like in the atmosphere on the surface of the wafer W after the etching. For example, in order to obtain the same effect of extending the Q-time of one hour to one week (168 hours) in just one hour of Q-time, it is necessary to reduce both of the oxygen partial pressure and the water vapor partial pressure by $1/168$ times. On the assumption that the atmospheric pressure is 101325 Pa and the ratio of oxygen and the ratio of water vapor in the atmosphere are respectively 21% and 4%, the oxygen partial pressure is calculated as follows: 101325 (Pa)×21(%)×1/168=127 (Pa), and the water vapor partial pressure is calculated as follows: 101325 (Pa)×4(%)×1/168=24.1 (Pa). Therefore, if the oxygen partial pressure and the water vapor partial pressure are respectively set to 127 Pa or less and 24.1 Pa or less, it is possible to sufficiently avoid an unexpected reaction that may occur on the surface and the inside of the wafer W. The unexpected reaction can occur by the action of oxygen, water, and the like contained in the atmosphere on the surface of the wafer W after the etching.

Second Embodiment

Figure 3:
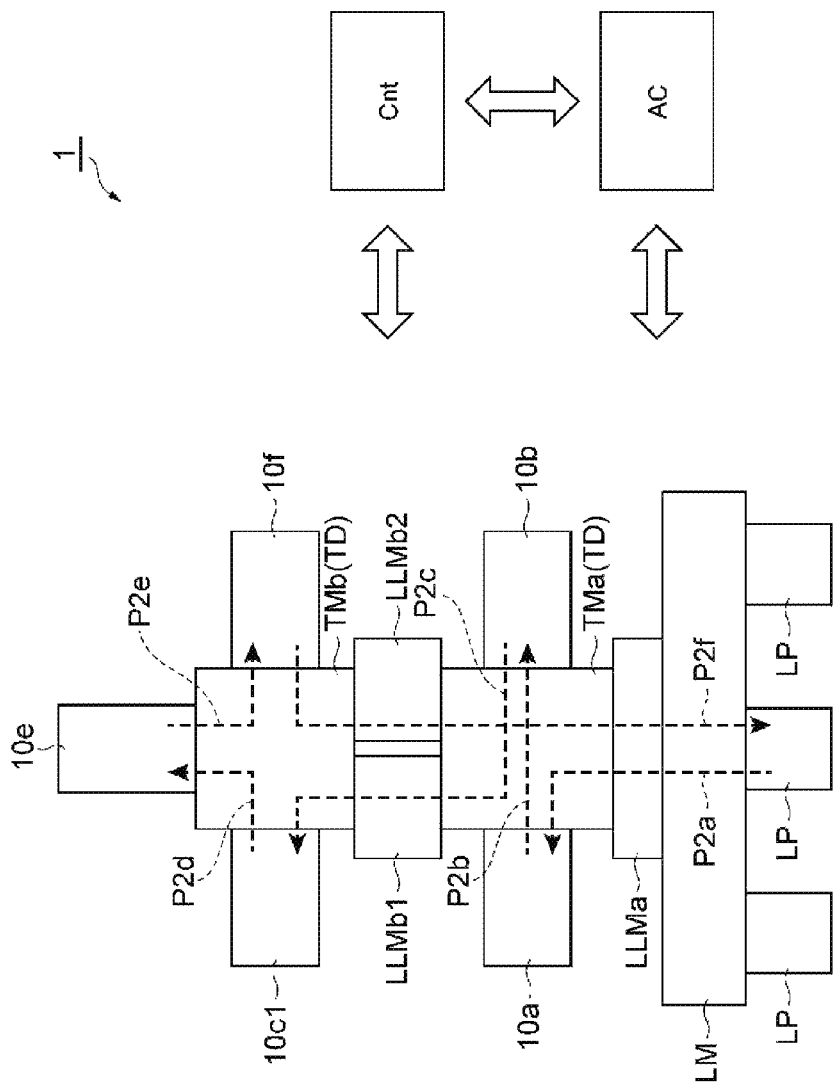
FIG. 3 schematically shows a configuration of a processing system according to a second embodiment as an exemplary embodiment.
Figure 4:
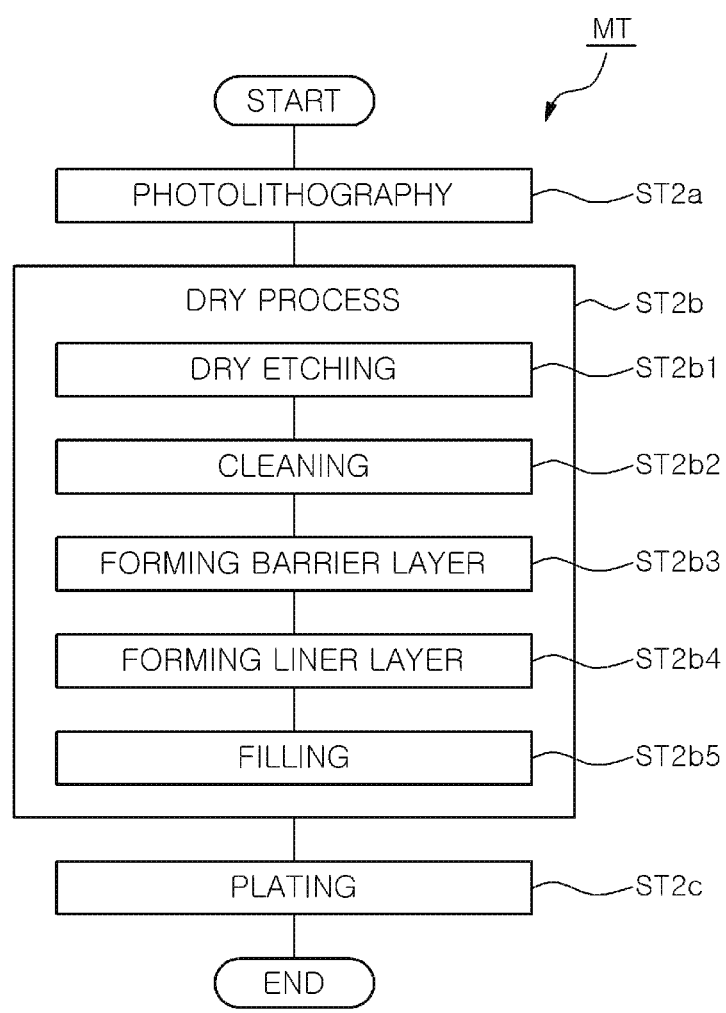
FIG. 4 is a flowchart of a processing method according to a second embodiment.

The second embodiment will be described with reference to FIG. 3. FIG. 3 schematically shows the configuration of the processing system 1 according to the second embodiment. FIG. 4 is a flowchart of a method MT according to the second embodiment. A part of the method MT shown in FIG. 4 can be performed by using the processing system 1 shown in FIG. 3. Hereinafter, in describing the second embodiment, the description on the components that are the same or similar to those included in the first embodiment will be omitted.

The processing system 1 shown in FIG. 3 includes a plurality of accommodating containers LP, a loader module LM, a transfer device TD, an atmospheric pressure control system AC, a control unit Cnt, and a plurality of processing modules 10a to 10f. The transfer device TD includes a load-lock module LLMa, a transfer module TMa, a load-lock module LLMb1, a load-lock module LLMb2, and a transfer module TMb.

The control unit Cnt is a computer including a processor, a storage unit, an input device, a display device, and the like, and integrally controls the respective components of the processing system 1 shown in FIG. 3. The control unit Cnt operates in response to a computer program (program based on an input recipe) for controlling the respective components of the processing system 1 shown in FIG. 3 in each step of the method MT shown in the flowchart of FIG. 4, and outputs a control signal. The control unit Cnt executes a part of the method MT shown in the flowchart of FIG. 4 by controlling the respective components of the processing system 1 shown in FIG. 3 with the control signal. The computer program for executing a part of the method MT shown in the flowchart of FIG. 4 and various computer programs used for executing a part of the method MT shown in the flowchart of FIG. 4 are readably stored in the storage unit of the control unit Cnt.

The transfer module TMb is connected to the load-lock module LLMb1, the load-lock module LLMb2, the processing module 10c1, the processing module 10e, and the processing module 10f. The transfer robot in the transfer module TMb can transfer the wafer W via the transfer module TMb. In that case, the wafer W can be transferred between the load-lock module LLMb1, the load-lock module LLMb2, the processing module 10c1, the processing module 10e, and the processing module 10f by the transfer robot.

In the processing system 1 according to the second embodiment, the wafer W is transferred in the order of paths P2a to P2f shown in FIG. 3 by the method MT shown in the flowchart of FIG. 4.

The processing module 10c1 (third processing module) performs a deposition process on the wafer W. More specifically, the processing module 10c1 is a plasma processing apparatus that can form a barrier layer on the wafer W by an ionized PVD method. The barrier layer formation performed by the processing module 10c1 is a dry process. The processing module 10c1 can form a TaN barrier layer.

The processing module 10e (third processing module) performs a deposition process on the wafer W. More specifically, the processing module 10e is a plasma processing apparatus that can form a liner layer on the wafer W by a CVD (Chemical Vapor Deposition) method. The liner film formation performed by the processing module 10e is a dry process. The processing module 10e can form a Ru liner layer.

The processing module 10f (third processing module) performs a deposition process on the wafer W. More specifically, the processing module 10f is a plasma processing apparatus that can perform a Cu filling process on the wafer W by an ionized PVD method. The Cu filling process performed by the processing module 10f is a dry process.

The control unit Cnt drives the processing modules 10a, 10b, 10c1, 10e, and 10f in that order.

The processing modules 10a and 10b are connected to the transfer module TMa. The processing modules 10c1, 10e, and 10f are connected to the transfer module TMb.

A part of the method MT shown in FIG. 4 is performed by using the processing system 1 shown in FIG. 3. The method MT shown in FIG. 4 includes steps ST2a, ST2b, and ST2c. The step ST2b includes steps ST2b1 (first step), ST2b2 (second step), ST2b3 (third step), and ST2b4 (third step), and ST2b5 (third step). The step ST2b is executed in one processing system 1 shown in FIG. 3. In the step ST2b of the method MT, the step ST2b1, the step ST2b2, the step ST2b3, the step ST2b4, the step ST2b5 are executed in that order. More specifically, in the step ST2b, the step ST2b1 is executed first. Then, the step ST2b2 is executed. Then, the step ST2b3 is executed. Then, the step ST2b4 is executed. Then, the step ST2b5 is executed. The wafer W is not exposed to the outside of the processing system 1 during the execution of the step ST2b, and thus is not exposed to the atmosphere.

The steps ST2a, ST2b1, ST2b2, and ST2c shown in FIG. 4 are the same as the steps ST1a, ST1b1, ST1b2, and ST1c shown in FIG. 2.

Upon completion of the step ST2a, the wafer W is transferred to the processing system 1. In the processing system 1, the step ST2b subsequent to the step ST2a is executed. In the step ST2b, only the dry process is performed in the processing system 1 under a consistent vacuum environment. The step ST2b includes steps ST2b1 to ST2b5.

The wafer W transferred to the processing system 1 is transferred along the path P2a to the processing module 10a via the accommodating container LP, the loader module LM, the load-lock module LLMa, and the transfer module TMa in that order. The wafer W transferred to the processing module 10a is subjected to the step ST2b1 (etching using the RIE method) by the processing module 10a.

The wafer W that has been subjected to the etching process in the step ST2b1 is transferred along the path P2b from the processing module 10a to the processing module 10b via the transfer module TMa in a vacuum state. The wafer W is transferred from the processing module 10a to the processing module 10b via the transfer module TMa in a vacuum state without being exposed to the atmosphere under a consistent vacuum environment. The wafer W transferred to the processing module 10b is subjected to the step ST2b2 (cleaning process) by the processing module 10.

The wafer W that has been subjected to the cleaning process in the ST2b2 is transferred to the processing module 10c1 along the path P1c. In that case, the wafer W can be transferred from the processing module 10b to the processing module 10c1 via the transfer module TMa in a vacuum state, the load-lock module LLMb1 in a vacuum state, and the transfer module TMb in a vacuum state in that order. The wafer W is transferred from the processing module 10b to the processing module 10c1 in a consistent vacuum environment without being exposed to the atmosphere. In that case, the wafer W is transferred via the transfer module TMa in a vacuum state, the load-lock module LLMb1 in a vacuum state, and the transfer module TMb in a vacuum state in that order. The wafer W transferred to the processing module 10c1 is subjected to the step ST2b3 by the processing module 10c1.

In the step ST2b3 (third step), a deposition process is performed on the wafer W. More specifically, in the step ST2b3, the processing module 10c1 forms a TiN barrier layer on the wafer W by an ionized PVD method.

The wafer W that has been subjected to the barrier layer formation in the step ST2b3 is transferred along the path P2d from the processing module 10c1 to the processing module 10e via the transfer module TMb in a vacuum state. The wafer W is transferred from the processing module 10c1 to the processing module 10e via the transfer module TMb in a vacuum state without being exposed to the atmosphere under a consistent vacuum environment. The wafer W transferred to the processing module 10e is subjected to the step ST2b4 by the processing module 10e.

In the step ST2b4 (third step), a deposition process is performed on the wafer W. More specifically, in the step ST2b4, the processing module 10e forms a Ru liner layer on the wafer W by a CVD method.

After the Ru liner layer formation in the step ST2b4, the wafer W is transferred along the path P2e from the processing module 10e to the processing module 10f via the transfer module TMb in a vacuum state. The wafer W is transferred from the processing module 10e to the processing module 10f via the transfer module TMb in a vacuum state without being exposed to the atmosphere under a consistent vacuum environment. The wafer W transferred to the processing module 10f is subjected to the step ST2b5 by the processing module 10f.

In the step ST2b5 (third step), a deposition process is performed on the wafer W. More specifically, in the step ST2b5, the processing module 10f performs a Cu filling process on the wafer W by an ionization PVD method. In order to effectively fill Cu, the wafer W may be heated to a temperature ranging from 250° C. to 350° C. in the ionized PVD to also utilize the Cu reflow phenomenon.

Upon completion of the step ST2b5, in the processing system 1, the wafer W is transferred to the accommodating container LP along the path P2f. In that case, the wafer W is transferred from the processing module 10f to the accommodating container LP via the transfer module TMb, the load-lock module LLMb2, the transfer module TMa, the load-lock module LLMa, and the loader module LM in that order. Thereafter, the wafer W is transferred to another processing system, and the step ST2c is executed.

Upon completion of the step ST2b5, i.e., in the step ST2c subsequent to the step ST2b, Cu is electrolytically plated, whereby a wiring groove or the like of the wafer W is filled with Cu. The step ST2c may be executed in a processing system different from the processing system 1 shown in FIG. 3. In that case, the wafer W is unloaded from the processing system 1 shown in FIG. 3 to the outside after the step ST2b, and then loaded into a processing system different from the processing system 1 shown in FIG. 3.

The processing system 1 and the method MT according to the above-described second embodiment can provide the same operational effects as those of the first embodiment. The second embodiment is more applicable to a fine wiring.

Third Embodiment

Figure 5:
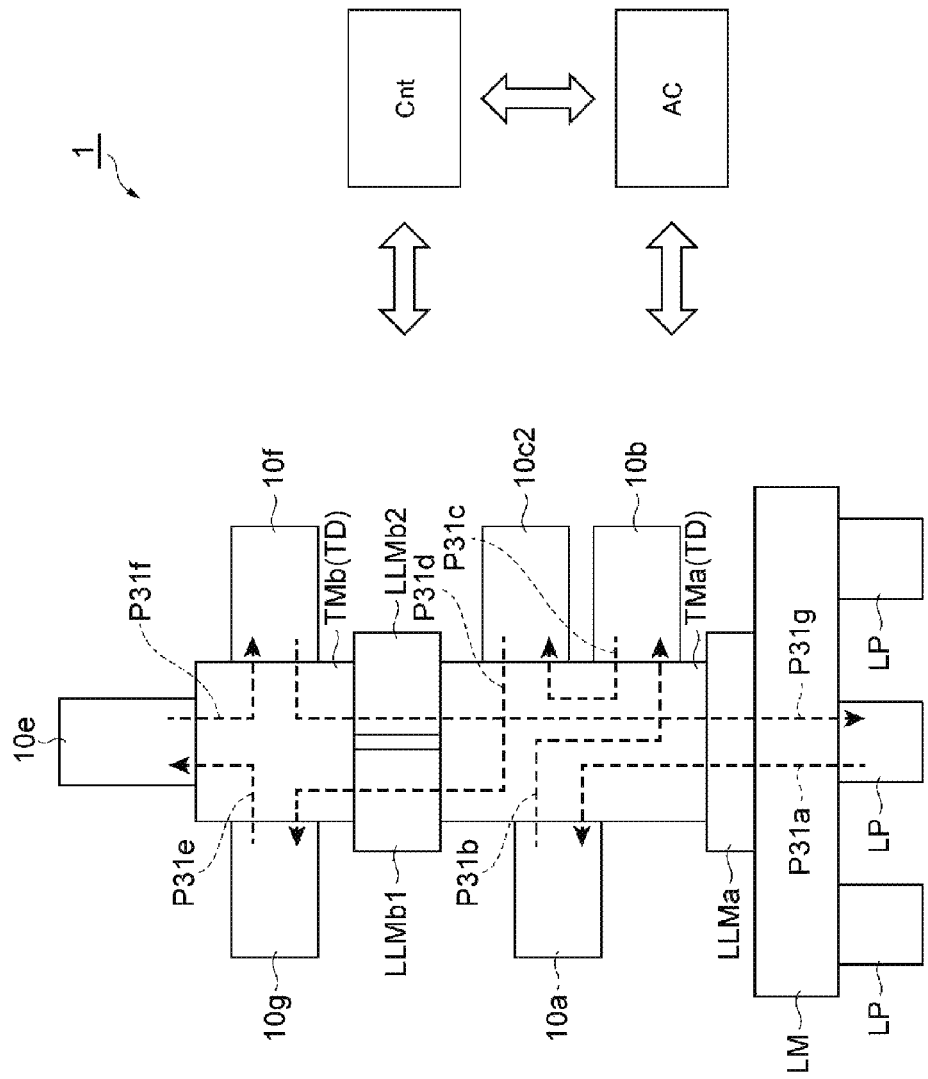
FIG. 5 schematically shows a configuration of a processing system according to a third embodiment as an exemplary embodiment.
Figure 6:
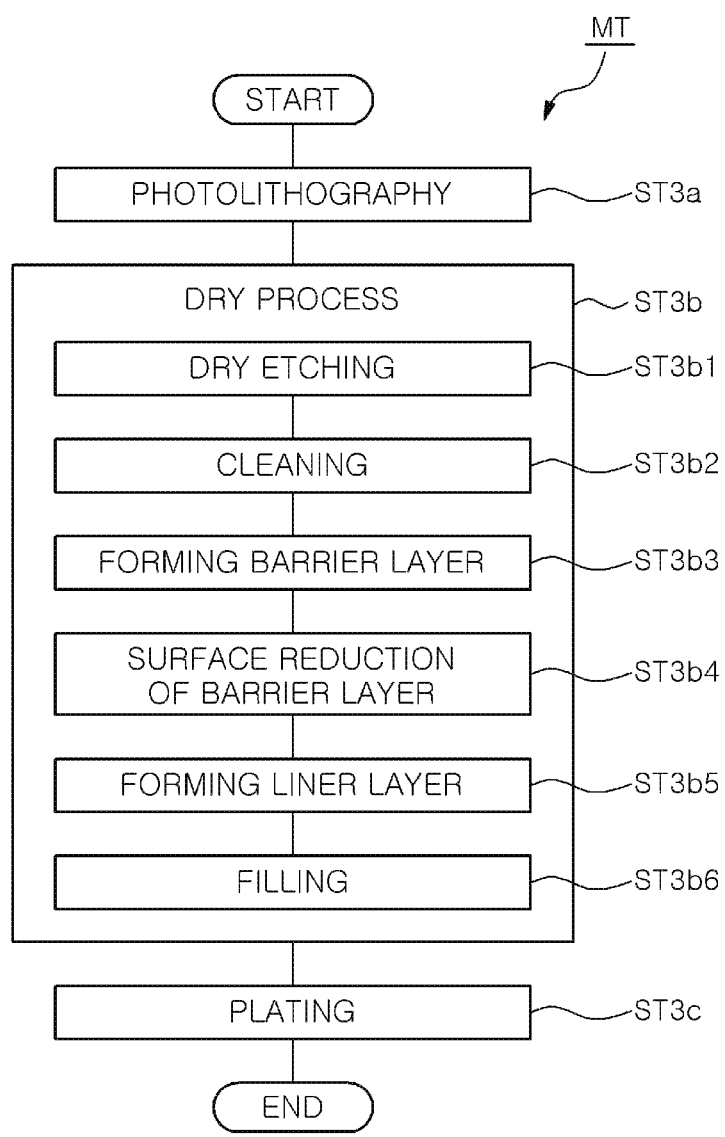
FIG. 6 is a flowchart of a processing method according to a third embodiment.

The third embodiment will be described with reference to FIGS. 5 and 6. FIG. 5 schematically shows the configuration of the processing system 1 according to the third embodiment. FIG. 6 is a flowchart of a method MT according to the third embodiment. A part of the method MT shown in FIG. 6 can be performed by the processing system 1 shown in FIG. 5. Hereinafter, in describing the third embodiment, the description on the components that are the same or similar to those in the first embodiment and the second embodiment will be omitted.

The processing system 1 shown in FIG. 5 includes a plurality of accommodating containers LP, a loader module LM, a transfer device TD, an atmospheric pressure control system AC, a control unit Cnt, and a plurality of processing modules 10a, 10b, 10c2, 10e, 10g, and 10f. The transfer device TD includes a load-lock module LLMa, a transfer module TMa, a load-lock module LLMb1, a load-lock module LLMb2, and a transfer module TMb.

The control unit Cnt is a computer including a processor, a storage unit, an input device, a display device, and the like, and integrally controls the respective components of the processing system 1 shown in FIG. 5. The control unit Cnt operates in response to a computer program (program based on an input recipe) for controlling the respective components of the processing system 1 shown in FIG. 5 in each step of the method MT shown in the flow chart of FIG. 6, and outputs a control signal. The control unit Cnt executes a part of the method MT shown in the flowchart of FIG. 6 by controlling the respective components of the processing system 1 shown in FIG. 5 with the control signal. The computer program for executing a part of the method MT shown in the flowchart of FIG. 6 and various data used for executing a part of the method MT shown in the flowchart of FIG. 6 are readably stored in the storage unit of the control unit Cnt.

The transfer module TMa is connected to the load-lock modules LLMa, LLMb1, and LLMb2, and the processing modules 10a, 10b, and 10c2. The transfer robot in the transfer module TMa can transfer the wafer W between the load-lock module LLMa, the processing module 10a, the processing module 10b, and the processing module 10c2 via the transfer module TMa.

The transfer module TMb is connected to the load-lock modules LLMb1 and LLMb2, and the processing modules 10g, 10e, and 10f. The transfer robot in the transfer module TMb can transfer the wafer W via the transfer module TMb. In that case, the wafer W can be transferred by the transfer robot in the transfer module TMb between the load-lock modules LLMb1, the load-lock module LLMb2, the processing module 10g, the processing module 10e, and the processing module 10f.

In the processing system 1 according to the third embodiment, the wafer W is transferred in the order of the paths P31a to P31g shown in FIG. 5 by the method MT shown in the flowchart of FIG. 6.

The processing module 10c2 (third processing module) performs a deposition process on the wafer W. More specifically, the processing module 10c2 is a heat treatment apparatus that can form a barrier layer on the wafer W by an ALD (Atomic Layer Deposition) method. The barrier layer formation performed by the processing module 10c2 is a dry process. The processing module 10c2 may form a $MnO_x$ barrier layer (x being a positive number, hereinafter the same).

The processing module 10g performs surface reduction treatment on the barrier layer of the wafer W. More specifically, the processing module 10g is a plasma processing apparatus that can perform surface reduction treatment on the barrier layer of MnOx. The surface reduction treatment performed by the processing module 10g is a dry process.

The control unit Cnt drives the processing module 10a, the processing module 10b, the processing module 10c2, the processing module 10g, the processing module 10e, and the processing module 10f in that order.

The processing modules 10a, 10b, and 10c2 are connected to the transfer module TMa. The processing modules 10g, 10e, and 10f are connected to the transfer module TMb.

A part of the method MT shown in FIG. 6 is performed by the processing system 1 shown in FIG. 5. The method MT shown in FIG. 6 includes steps ST3a, ST3b, and ST3c. The step ST3b includes steps ST3b1 (first step), ST3b2 (second step), ST3b3 (third step), ST3b4 (second step), ST3b5 (third step), and ST3b6 (third step). The step ST3b is executed in one processing system 1 shown in FIG. 5. In the step ST3b of the method MT, the steps ST3b1, ST3b2, ST3b3, ST3b4, ST3b5, and ST3b6 are executed in that order. More specifically, in the step ST3b, the step ST3b1 is executed first. Then, the step ST3b2 is executed. Then, the step ST3b3 is executed. Then, the step ST3b4 is executed. Then, the step ST3b5 is executed. Then, the step ST3b6 is executed. The wafer W is not exposed to the outside of the processing system 1 during the execution of the step ST3b, and thus is not exposed to the atmosphere.

The steps ST3a, ST3b1, ST3b2, and ST3c shown in FIG. 6 are respectively the same as the steps ST1a, ST1b1, ST1b2, and ST1c shown in FIG. 2. Further, the steps ST3b5 and ST3b6 shown in FIG. 6 are respectively the same as the steps ST2b4 and ST2b5 shown in FIG. 4.

Upon completion of the step ST3a, the wafer W is transferred to the processing system 1. In the processing system 1, the step ST3b subsequent to the step ST3a is executed. In the step ST3b, only the dry process is executed in the processing system 1 under a consistent vacuum environment. The step ST3b includes steps ST3b1 to ST3b6.

The wafer W transferred to the processing system 1 is transferred along the path P31a to the processing module 10a via the accommodating container LP, the loader module LM, the load-lock module LLMa, and the transfer module TMa in that order. The wafer W transferred to the processing module 10a is subjected to the step ST3b1 (etching using the RIE method) by the processing module 10a.

The wafer W that has been subjected to the etching process in the step ST3b1 is transferred along the path P31b from the processing module 10a to the processing module 10b via the transfer module TMa in a vacuum state. The wafer W is transferred from the processing module 10a to the processing module 10b via the transfer module TMa in a vacuum state without being exposed to the atmosphere under a consistent vacuum environment. The wafer W transferred to the processing module 10b is subjected to the step ST3b2 (cleaning process) by the processing module 10b.

The wafer W that has been subjected to the cleaning process in the step ST3b2 is transferred along the path P31c from the processing module 10b to the processing module 10c2 via the transfer module TMa in a vacuum state. The wafer W is transferred from the processing module 10b to the processing module 10c2 via the transfer module TMa in a vacuum state without being exposed to the atmosphere under a consistent vacuum environment. The wafer W transferred to the processing module 10c2 is subjected to the step ST3b3 by the processing module 10c2.

In the step ST3b3 (third step), a deposition process is performed on the wafer W. More specifically, in the step ST3b3, the processing module 10c2 forms an $MnO_x$ barrier layer on the wafer W by using the ALD method.

The wafer W that has been subject to the barrier layer formation in the step ST3b3 is transferred to the processing module 10g along the path P31d. In that case, the wafer W can be transferred from the processing module 10c2 to the processing module 10g via the transfer module TMa in a vacuum state, the load-lock module LLMb1 in a vacuum state, and the transfer module TMb in a vacuum state in that order. The wafer W is transferred from the processing module 10c2 to the processing module 10g without being exposed to the atmosphere under a consistent vacuum environment. In that case, the wafer W is transferred via the transfer module TMa in a vacuum state, the load-lock module LLMb1 in a vacuum state, and the transfer module TMb in a vacuum state in that order. The wafer W transferred to the processing module 10g is subjected to the step ST3b4 by the processing module 10g.

In the step ST3b4 (second step), surface reduction treatment is performed on the wafer W. More specifically, in the step ST3b4, the processing module 10g performs surface reduction treatment on the $MnO_x$ barrier layer of the wafer W by using hydrogen radicals. Due to the surface reduction treatment, the surface of the $MnO_x$ layer is reduced to metal Mn and, thus, Ru liner layer formation to be performed later by the CVD method becomes easier. The wafer W is heated to about 300° C. during the surface reduction treatment. Accordingly, the $MnO_x$ layer reacts with the underlying interlayer insulating film, thereby generating a silicate layer. Although the silicate layer has a thickness of a few nm, it has a good barrier property.

The wafer W that has been subjected to the surface reduction in the step ST3b4 is transferred along the path P31e from the processing module 10g to the processing module 10e via the transfer module TMb in a vacuum state. The wafer W is transferred from the processing module 10g to the processing module 10e via the transfer module TMb in a vacuum state without being exposed to the atmosphere under a consistent vacuum environment. The wafer W transferred to the processing module 10e is subjected to the step ST3b5 by the processing module 10e.

In the step ST3b5 (third step), a deposition process is performed on the wafer W. More specifically, in the step ST3b5, the processing module 10e forms a Ru liner layer on the wafer W by using the CVD method.

After the Ru liner layer is formed in the step ST3b5, the wafer W is transferred along the path P31f from the processing module 10e to the processing module 10f via the transfer module TMb in a vacuum state. The wafer W is transferred from the processing module 10e to the processing module 10f via the transfer module TMb in a vacuum state without being exposed to the atmosphere under a consistent vacuum environment. The wafer W transferred to the processing module 10f is subjected to the step ST3b6 by the processing module 10f.

In the step ST3b6 (third step), a deposition process is performed on the wafer W. More specifically, in the step ST3b6, the processing module 10f performs a Cu filling process on the wafer W by using the ionized PVD method.

Upon completion of the step ST3b6, in the processing system 1, the wafer W is transferred to the accommodating container LP along the path P31g. In that case, the wafer W is transferred from the processing module 10f to the container LP via the transfer module TMb, the load-lock module LLMb2, the transfer module TMa, the load-lock module LLMa, and the loader module LM in that order. Thereafter, the wafer W is transferred to another processing system, and the step ST3c is executed.

Upon completion of the step ST3b6, i.e., in the step ST3c subsequent to the step ST3b, Cu is electrolytically plated, whereby a wiring groove or the like of the wafer W is filled with Cu. The step ST3c may be executed in a processing system different from the processing system 1 shown in FIG. 5. In that case, the wafer W is unloaded from the processing system 1 shown in FIG. 5 to the outside after the step ST3b, and then is loaded into the processing system different from the processing system 1 shown FIG. 5.

The processing system 1 and the method MT according to the above-described third embodiment can provide the same operational effects as those of the first embodiment. Further, in the third embodiment, it is possible to reduce the thickness of the barrier layer and improve the applicablility to a fine wiring.

Modification of Third Embodiment

The modification of the third embodiment will be described with reference to FIG. 7. In the processing system 1 of the present modification, as shown in FIG. 7, the processing modules 10a to 10f of the processing system 1 shown in FIG. 5 are allocated to two processing systems 1a and 1b.

Figure 7:
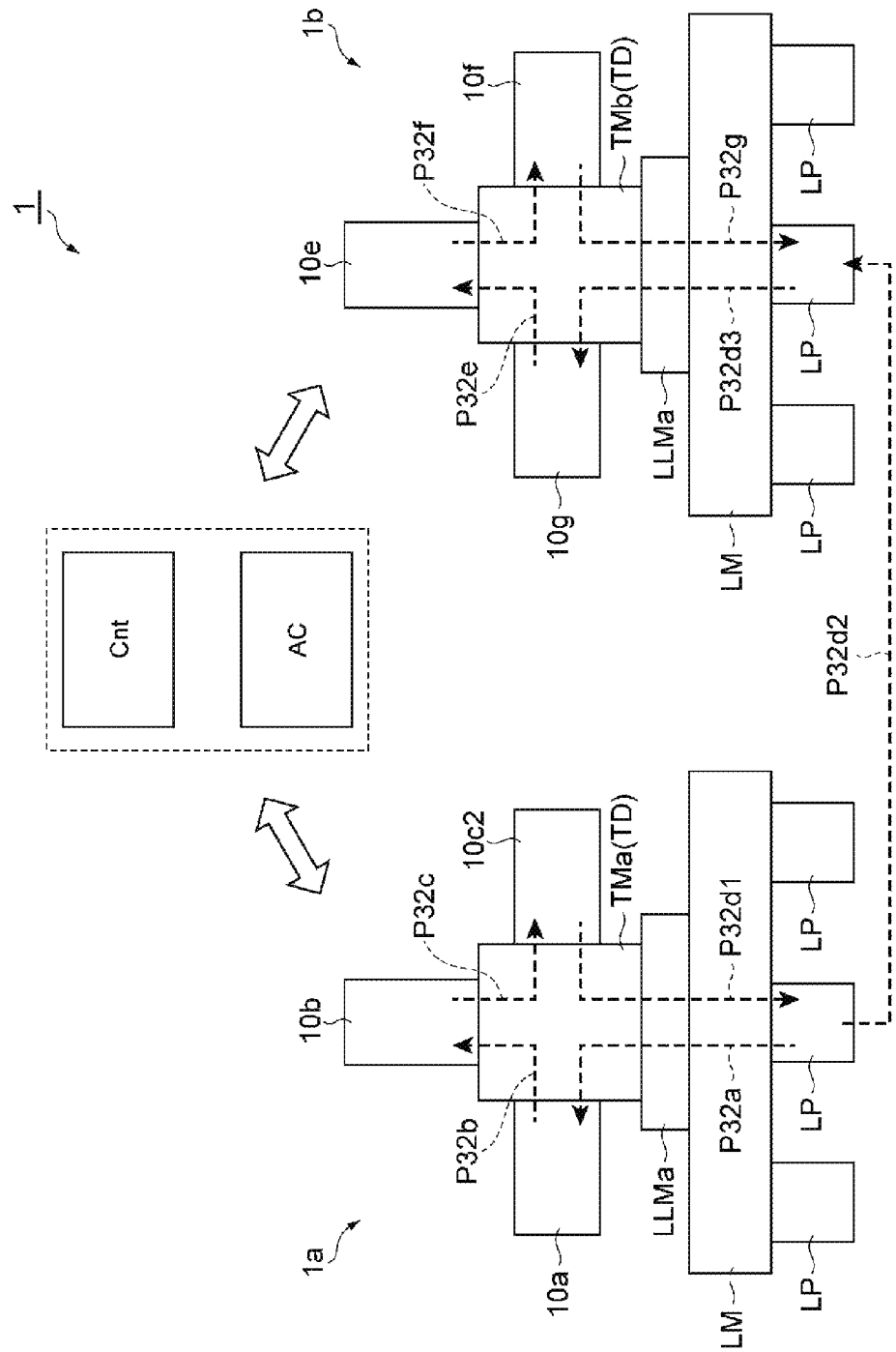
FIG. 7 schematically shows a configuration of a processing system according to a modification of the third embodiment.

The processing modules 10a, 10b, and 10c2 connected to the transfer module TMa shown in FIG. 5 are provided in the processing system 1a shown in FIG. 7. The processing modules 10g, 10e, and 10f connected to the transfer module TMb shown in FIG. 5 are provided in the processing system 1b shown in FIG. 7.

In other words, although a part of the method MT shown in the flowchart of FIG. 6 is performed by the processing system 1 shown in FIG. 5, a part of the method MT may also be performed by the processing system 1 shown in FIG. 7. The transfer unit TD of the processing system 1 shown in FIG. 7 includes a load-lock module LLMa and a transfer module TMa in the processing system 1a, and a load-lock module LLMa and a transfer module TMb in the processing system 1b.

In the case where a part of the method MT shown in the flowchart of FIG. 6 is performed by the processing system 1 shown in FIG. 7, the wafer W is transferred along the path P32a from the accommodating container LP, the loader module LM, and the load-lock module LLMa to the processing module 10a via the transfer module TMa. Then, the step ST3b1 is executed in the processing module 10a.

Upon completion of the step ST3b1, the wafer W is transferred along the path P32b from the processing module 10a to the processing module 10b, and the step ST3b2 is executed in the processing module 10b.

Upon completion of the step ST3b2, the wafer W is transferred along the path P32c from the processing module 10b to the processing module 10c2 via the transfer module TMa, and the step ST3b3 is executed in the processing module 10c2.

Upon completion of the step ST3b3, in the processing system 1a, the wafer W is transferred along the path P32d1 from the processing module 10c2 to the load-lock module LLMa, the loader module LM, and the storage container LP in that order via the transfer module TMa. Thereafter, the wafer W is transferred along the path P32d2 from the accommodating container LP of the processing system 1a to the accommodating container LP of the processing system 1b under an atmospheric exposure environment.

The wafer W transferred to the accommodating container LP of the processing system 1b is transferred along the path P32d3 to the processing module 10g via the loader module LM, the load-lock module LLMa, and the transfer module TMb in the processing system 1b in that order. Then, the step ST3b4 is executed in the processing module 10g.

Upon completion of the step ST3b4, the wafer W is transferred along the path P32e from the processing module 10g to the processing module 10e via the transfer module TMb, and the step ST3b5 is executed in the processing module 10e.

Upon completion of the step ST3b5, the wafer W is transferred along the path P32f from the processing module 10e to the processing module 10f via the transfer module TMb, and the step ST3b6 is executed in the processing module 10f.

Upon completion of the step ST3b6, in the processing system 1b, the wafer W is transferred along the path P32g from the processing module 10f to the accommodating container LP via the transfer module TMb, the load-lock module LLMa, and the loader module LM. Thereafter, the wafer W is transferred to another processing system, and the step ST3c is executed.

The processing system 1 and the method MT according to the modification of the third embodiment can provide the same operational effects as those of the first embodiment. In the modification of the third embodiment, it is possible to use a relatively inexpensive transfer system and a conventional transfer system. Here, the reason why the processing system 1 can be divided into the processing system 1a and the processing system 1b in the modification of the third embodiment will be described. The $MnO_x$ barrier layer formed in the processing module 10c2 is an oxide film and is not oxidized any more even when it is exposed to the atmosphere. Even if $MnO_x$ is oxidized by the exposure to the atmosphere, the surface reduction treatment to be performed later in the processing module 10g can eliminate the influence of the exposure to the atmosphere. From the above, it is preferable to divide the processing system 1 into the processing systems 1a and 1b. Since the device is covered with $MnO_x$ and serves as a cap film, an inner low-k film or Cu is not brought into contact with the atmosphere even when it is exposed to the atmosphere. Therefore, it is preferable to divide the processing system 1 into the processing systems 1a and 1b.

Fourth Embodiment

Figure 8:
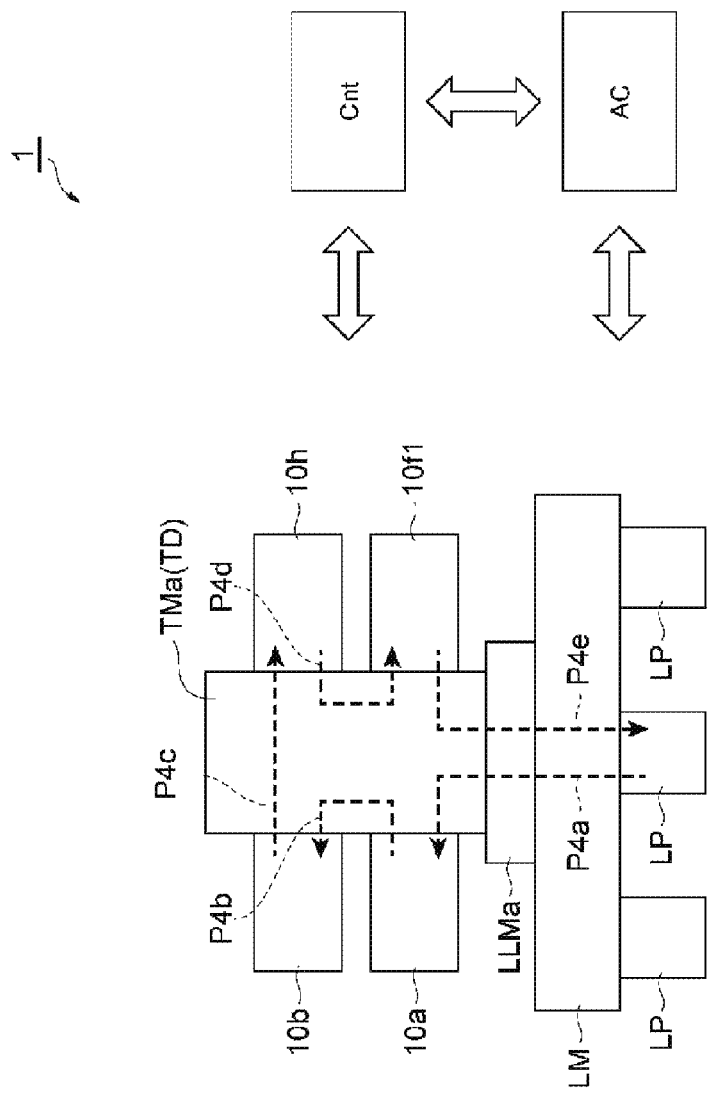
FIG. 8 schematically shows a configuration of a processing system according to a fourth embodiment as an exemplary embodiment.
Figure 9:
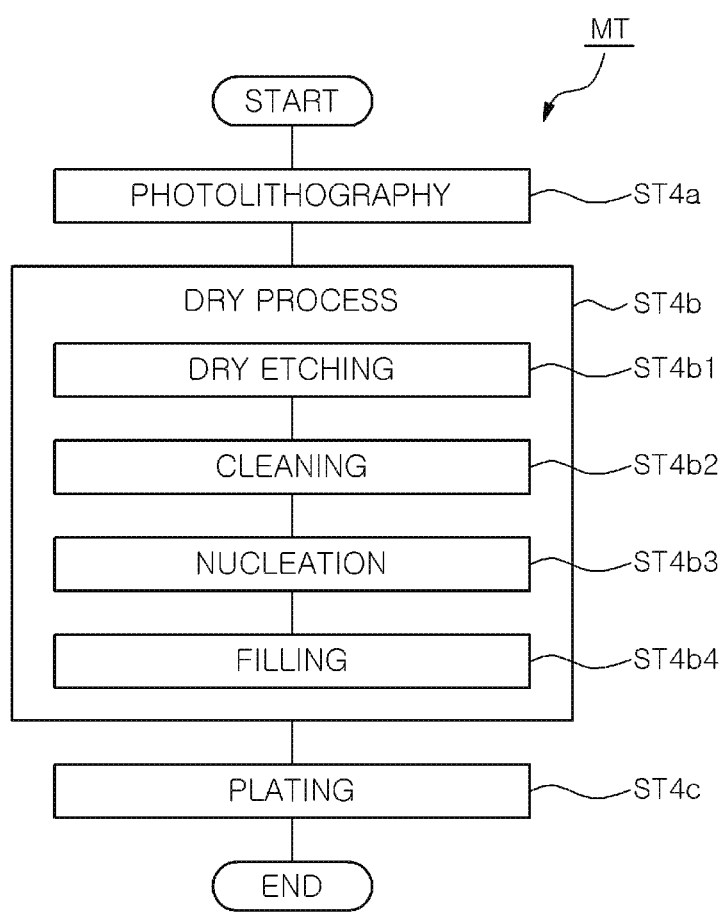
FIG. 9 is a flowchart of a processing method according to the fourth embodiment.

The fourth embodiment will be described with reference to FIG. 8. FIG. 8 schematically shows the configuration of the processing system 1 according to the fourth embodiment. FIG. 9 is a flowchart of a method MT according to the fourth embodiment. A part of the method MT shown in FIG. 9 can be performed by the processing system 1 shown in FIG. 8. Hereinafter, in describing the fourth embodiment, the description on the components that are included in the first to the third embodiment will be omitted for avoiding redundant description.

The processing system 1 shown in FIG. 8 includes a plurality of accommodating containers LP, a loader module LM, a transfer device TD, an atmospheric pressure control system AC, a control unit Cnt, a plurality of processing modules 10a, 10b, 10h, and 10f1. The transfer device TD includes a load-lock module LLMa and a transfer module TMa.

The control unit Cnt is a computer including a processor, a storage unit, an input device, a display device, and the like, and integrally controls the respective components of the processing system 1 shown in FIG. 8. The control unit Cnt operates in response to a computer program (program based on an input recipe) for controlling the respective components of the processing system 1 shown in FIG. 8 in each step of the method MT shown in the flowchart of FIG. 9, and outputs a control signal. The control unit Cnt performs a part of the method MT shown in the flowchart of FIG. 9 by controlling the respective components of the processing system 1 shown in FIG. 8 with the control signal. The computer program for executing a part of the method MT shown in the flowchart of FIG. 9 and various data used for executing a part of the method MT shown in the flowchart of FIG. 9 are readably stored in the storage unit of the control unit Cnt.

The transfer module TMa is connected to the load-lock module LLMa and the processing modules 10a, 10b, 10h, and 10f1. The transfer robot in the transfer module TMa can transfer the wafer W via the transfer module TMa. In that case, the wafer W can be transferred between the load-lock module LLMa, the processing module 10a, the processing module 10b, the processing module 10h, and the processing module 10f1 by the transfer robot.

In the processing system 1 according to the fourth embodiment, the wafer W is transferred in the order of paths P4a to P4e shown in FIG. 8 by the method MT shown in the flowchart of FIG. 9.

The processing module 10h (third processing module) performs a deposition process on the wafer W. More specifically, the processing module 10h is a plasma processing apparatus that can perform a nucleation process on the wafer W by the CVD method. The nucleation process performed by the processing module 10h is a dry process.

The processing module 10f1 (third processing module) performs a deposition process on the wafer W. More specifically, the processing module 10f1 is a plasma processing apparatus that can perform a Ru filling process on the wafer W by the CVD method. The Ru filling process performed by the processing module 10f1 is a dry process.

The control unit Cnt drives the processing modules 10a, 10b, 10h, and 10f1 in that order.

The processing modules 10a, 10b, 10h, and 10f1 are both connected to the transfer module TMa.

A part of the method MT shown in FIG. 9 is performed by the processing system 1 shown in FIG. 8. The method MT shown in FIG. 9 includes steps ST4a, ST4b, and ST4c. The step ST4b includes steps ST4b1 (first step), ST4b2 (second step), ST4b3 (third step), and ST4b4 (third step). The step ST4b is executed in one processing system 1 shown in FIG. 8. In the step ST4b of method MT, the steps ST4b1, ST4b2, ST4b3, and ST4b4 are executed in that order. More specifically, in step ST4b, the step ST4b1 is executed first. Then, the step ST4b2 is executed. Then, the ST4b3 is executed. Then, the ST4b4 is executed. The wafer W is not exposed to the outside of the processing system 1 during the execution of the step ST4b, and thus is not exposed to the atmosphere.

The steps ST4a, ST4b1, ST4b2, and ST4c shown in FIG. 9 are the same as the steps ST1a, ST1b1, ST1b2, and ST1c shown in FIG. 2.

After the step ST4a, the wafer W is transferred to the processing system 1. In the processing system 1, the step ST4b subsequent to the step ST4a is executed. In the step ST4b, only the dry process is executed in the processing system 1 under a consistent vacuum environment. The step ST4b includes steps ST4b1 to ST4b4.

The wafer W transferred to the processing system 1 is transferred along the path P4a to the processing module 10a via the accommodating container LP, the loader module LM, the load-lock module LLMa, and the transfer module TMa in that order. The wafer W transferred to the processing module 10a is subjected to the step ST4b1 (etching using the RIE method) by the processing module 10a.

The wafer W that has been subjected to the etching process in the step ST4b1 is transferred along the path P4b from the processing module 10a to the processing module 10b via the vacuum transfer module TMa. The wafer W is transferred from the processing module 10a to the processing module 10b via the transfer module TMa in a vacuum state without being exposed to the atmosphere under a consistent vacuum environment. The wafer W transferred to the processing module 10b is subjected to the step ST4b2 (cleaning process) by the processing module 10b.

The wafer W that has been subjected to the cleaning process in the step ST4b2 is transferred along the path P4c from the processing module 10b to the processing module 10h via the transfer module TMa in a vacuum state. The wafer W is transferred from the processing module 10b to the processing module 10h via the transfer module TMa in a vacuum state without being exposed to the atmosphere under a consistent vacuum environment. The wafer W transferred to the processing module 10h is subjected to the step ST4b3 by the processing module 10h.

In the step ST4b3 (third step), a deposition process is performed on the wafer W. More specifically, in the step ST4b3, the processing module 10h performs a nucleation process on the wafer W by the CVD method. In the nucleation process, the metal grows in an island shape and a continuous film is not required. Due to the nucleation process, nuclei of metal of about several nm are formed on the surface of the wafer W. As for a nucleation metal, it is preferable to use those that are not easily oxidized even in a low vacuum state and have been introduced in conventional devices. Specifically, it is possible to use TiN, MnN, Co, Ni, Ru, Rh, Pd, Sn, W, $WSi_x$, Os, Ir, Pt, and the like. Due to the presence of metal nuclei, the liner layer can be easily formed by the CVD method.

The wafer W that has been subjected to the nucleation process in the step ST4b3 is transferred along the path P4d from the processing module 10h to the processing module 10f1 via the transfer module TMa in a vacuum state. The wafer W is transferred from the processing module 10h to the processing module 10f1 via the transfer module TMa in a vacuum state without being exposed to the atmosphere under a consistent vacuum environment. The wafer W transferred to the processing module 10f1 is subjected to the step ST4b4 by the processing module 10f1.

In the step ST4b4 (third step), a deposition process is performed on the wafer W. More specifically, in the step ST4b4, the processing module 10f1 fills a wiring material in the wafer W by the CVD method. As for the wiring material, Ru, Co, Ni can be used. In the present disclosure, Ru is filled, for example.

When the step ST4b4 is completed, in the processing system 1, the wafer W is transferred along the path P4e from the processing module 10f1 to the accommodating container LP via the transfer module TMa, the load-lock module LLMa, and the loader module LM in that order. Thereafter, the wafer W is transferred to another processing system, and the step ST4c is executed.

After the step ST4b4, i.e., in the step ST4c subsequent to the step ST4b, Cu is electrolytically plated, whereby a wiring groove or the like of the wafer W is filled with Cu. The step ST4c can be executed in a processing system different from the processing system 1 shown in FIG. 8. In this case, the wafer W is unloaded from the processing system shown in FIG. 8 to the outside after the step ST4b, and then is loaded into a processing system different from the processing system 1 shown in FIG. 8.

The processing system 1 and the method MT according to the fourth embodiment can provide the same operational effects as those of the first embodiment. In the fourth embodiment, it is possible to deal with a configuration in which the wafer W does not include a barrier layer and also possible to reduce the wiring resistance. Since the processing module (for performing a deposition process on the wafer W) is not a sputtering device but a CVD apparatus, it is not necessary to set a pressure in the transfer module to a high vacuum level and a turbo molecular pump is not required, which is cost-effective.

While various embodiments have been described above, various omissions, substitutions, and changes may be made without being limited to the above-described embodiments. Further, other embodiments can be implemented by combining elements in different embodiments.

For example, as for the processing module 10b, it is possible to use a plasma processing apparatus that can perform asking effectively. The processing module 10b performs surface treatment using hydrogen radicals generated by using a high frequency antenna. Such a plasma processing apparatus can supply high-density plasma that is not remote plasma and a large amount of hydrogen radicals generated from a large amount of hydrogen. The high-density plasma can be generated by, e.g., the plasma processing apparatus 100 shown in FIGS. 10 to 14, the microwave plasma processing apparatus 11 shown in FIGS. 15 and 16.

The plasma processing apparatus 100 is one of the ICP apparatuses and described in FIG. 1 of Japanese Patent Application Publication No. 2010-258324. Although the plasma processing apparatus 100 is an ICP apparatus, plasma can be generated at a relatively high pressure and, thus, a large amount of hydrogen radicals can be generated.

The microwave plasma processing apparatus 11 includes a radial line slot antenna. The radial line slot antenna generates microwave plasma.

In any of the plasma processing apparatus 100 and the microwave plasma processing apparatus 11, it is possible to form a radical-rich region having a relatively low electron temperature and a relatively high radical/ion ratio by sufficiently separating the top plate and the wafer W. By using such a radical-rich region, the processing module 10b can have an ion trap-less structure.

As for the processing module 10b, it is possible to use an ECR (Electron Cyclotron Resonance) plasma device, a helicon wave plasma device, or the like, other than the plasma processing apparatus 100 that is an ICP apparatus and the microwave plasma processing apparatus 11 having the radial line slot antenna.

Further, the processing module 10b can include a pump having a relatively high evacuation speed. In that case, the processing module 10b can use the pump to discharge substances produced by the processing in the processing module 10b at a relatively high speed. Accordingly, chemical reaction that may occur by the processing in the processing module 10b is promoted.

The processing module 10b (second step) can control a pressure in the processing module 10b such that two different pressures are alternately repeated while supplying hydrogen radicals into the processing module 10b (the periphery of the wafer W). The surface treatment can be performed by controlling the pressure in the above-described manner. The processing module 10b can alternately repeat a process of supplying hydrogen radicals into the processing module 10b at a first pressure and a process of stopping the supply of hydrogen radicals into the processing module 10b and setting a pressure in the processing module 10b to a second pressure. The second pressure is lower than the first pressure. The surface treatment can be performed by repeating these two processes. The pressure in the processing module 10b can be controlled by controlling, e.g., an opening degree of an APC (Adaptive Pressure Control) device. By performing the surface treatment at different pressures, the discharge of by-products generated in the pattern of the wafer W can be promoted. Particularly, the plasma processing apparatus 100 or the microwave plasma processing apparatus 11 as the processing module 10b can sufficiently supply hydrogen radicals even in an environment where the pressure varies (i.e., it is difficult to deactivate the plasma even if the pressure varies).

The transfer device TD may include the following gas exhaust systems (pump and purge gas). The transfer device TD can use at least one or both of a purge gas and a cryopump to control the oxygen partial pressure and the water vapor partial pressure in each of the transfer modules TMa and TMb. In other words, in the method MT, at least one or both of the purge gas and the cryopump can be used for controlling the oxygen partial pressure and the water vapor partial pressure around the wafer W between the first step, the second step, and the third step. The first step indicates any one of steps ST1b1, ST2b1, ST3b1, and ST4b1. The second step indicates any one of steps ST1b2, ST2b2, ST3b2, ST3b4, and ST4b2. The third step indicates any one of steps ST1b3, ST1b4, ST2b3, ST2b4, ST2b5, ST3b3, ST3b5, ST3b6, ST4b3, and ST4b4.

First, the transfer device TD may include a cryopump having a relatively high water evacuation rate. The transfer device TD can evacuate water vapor in each of the transfer modules TMa and TMb by using the cryopump. In other words, in the method MT, water vapor around the wafer W is evacuated between the first step, the second step, and the third step.

The cryopump has a relatively large operating pressure ranging from 10 Pa to $10^{-8}$ Pa. Therefore, in the case of using the cryopump, the installation of a TMP (turbo molecular pump) is optional. When only water in the transfer device TD is evacuated, the transfer device TD can use a water pump having an aggregation surface temperature of about 80 to 130 K.

The purge gas used in the transfer device TD may be an inert gas having an extremely low oxygen partial pressure (e.g., $10^{-19}$ Pa or less) generated in a yttria-stabilized zirconia (YSZ) tube. In that case, the transfer device TD is provided with the YSZ tube. By using such a purge gas, the oxidation of the exposed Cu wiring can be sufficiently suppressed.

The purge gas used in the transfer device TD may contain a relatively small amount of $H_2$ gas or CO gas that provides deoxidation. By using such a purge gas, the oxidation of the exposed Cu wiring can be sufficiently suppressed.

The configuration of the plasma processing apparatus 100 will be described with reference to FIGS. 10 to 14. The plasma processing apparatus 100 is an example of the processing module 10b in which the second step is executed. The second step indicates any one of step ST1b2, ST2b2, ST3b2, ST3b4, and ST4b2.

The plasma processing apparatus 100 is an ICP apparatus for performing predetermined plasma processing on a wafer W by plasma of a processing gas excited in a processing chamber by applying a high frequency power to a planar high frequency antenna. The plasma processing apparatus 100 includes a high frequency antenna 140. The high frequency antenna 140 is formed in a shape of a planar spiral coil for generating ICP. An inner antenna element 142A and an outer antenna element 142B of the high frequency antenna 140 are opened at both ends and grounded near the central portions (at or near the central point). Each of the inner antenna element 142A and the outer antenna element 142B resonates at a wavelength that is one half of a wavelength of a relatively high frequency signal supplied from each of a high frequency power supply 150A and a high frequency power supply 150B. In the case of the plasma processing apparatus 100 shown in FIGS. 10 to 14, the high frequency antenna 140 has two coils. However, the high frequency antenna 140 may have a single coil.

The plasma processing apparatus 100 includes a tubular (e.g., cylindrical) processing chamber 102 made of metal (e.g., aluminum). The processing chamber 102 does not necessarily have a cylindrical shape, and may also have a square tubular shape (e.g. a box shape).

A mounting table 110 for mounting thereon the wafer W is provided at a bottom portion of the processing chamber 102. The mounting table 110 is formed in a substantially columnar shape (e.g., cylindrical shape) and made of aluminum or the like. The shape of the mounting table 110 is not limited to the cylindrical shape. For example, the mounting table 110 may have a prismatic shape (e.g., polyprismatic shape). Although it is not shown, the mounting table 110 may have various functions, e.g., functions of an electrostatic chuck, a temperature control mechanism, and the like, if necessary. The electrostatic chuck attracts and holds the wafer W by Coulomb force. The temperature control mechanism may have a heater, a coolant path, and the like.

A plate-shaped dielectric member 104 is provided at the ceiling portion of the processing chamber 102 to face the mounting table 110. The plate-shaped dielectric member 104 may be made of, e.g., quartz glass, ceramic, or the like. The plate-shaped dielectric member 104 has, e.g., a disc shape. The plate-shaped dielectric member 104 is airtightly provided to block an opening formed at the ceiling portion of the processing chamber 102.

Figure 10:
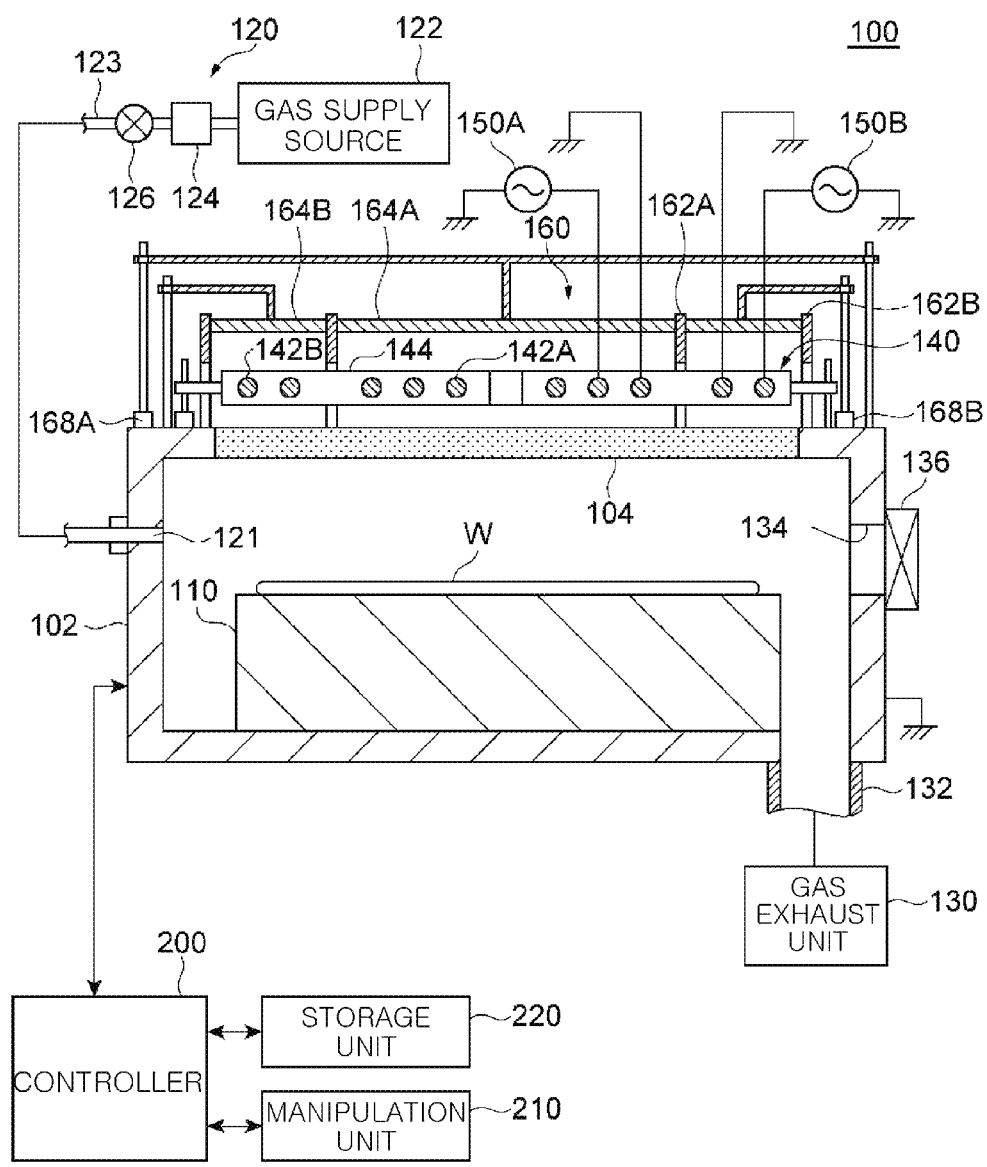
FIG. 10 shows an example of a specific configuration of a processing module for performing surface treatment on a wafer by using hydrogen radicals.

A gas supply unit 120 is provided at the processing chamber 102. The gas supply unit 120 supplies a processing gas for processing the wafer W, or the like. The gas supply unit 120 is configured as shown in FIG. 10, for example. A gas inlet port 121 is formed on a sidewall of the processing chamber 102. A gas supply source 122 is connected to the gas inlet port 121 through a gas supply line 123. A mass flow controller (MFS) 124 and an opening/closing valve 126 are provided in the gas supply line 123. The MFS 124 is an example of a flow rate controller for controlling the flow rate of the processing gas. The gas supply unit 120 supplies the processing gas at a predetermined flow rate controlled by the MFS 124 from the gas supply source 122 into the processing chamber 102 through the gas inlet port 121.

In FIG. 10, for convenience of description, the gas supply unit 120 is illustrated as a single gas line. However, the gas supply unit 120 does not necessarily supply a single processing gas, and may supply a plurality of gases as a processing gas. In that case, the gas supply unit 120 may include a plurality of gas supply sources, a plurality of gas lines, and a plurality of mass flow controllers respectively provided in the plurality of gas lines. Further, although FIG. 10 shows the case in which the gas supply unit 120 supplies a gas from the sidewall of the processing chamber 102, the present disclosure is not limited thereto. For example, a gas may be supplied from the ceiling portion of the processing chamber 102. In that case, a gas inlet port may be formed at, e.g., a central portion of the plate-shaped dielectric member 104, and the gas may be supplied through the gas inlet port.

A gas exhaust unit 130 is connected to the bottom portion of the processing chamber 102 through a gas exhaust line 132. The gas exhaust unit 130 exhausts the atmosphere in the processing chamber 102. The gas exhaust unit 130 includes, e.g., a vacuum pump. The gas exhaust unit 130 can reduce a pressure in the processing chamber 102 to a predetermined level. A wafer loading/unloading port 134 is formed on the sidewall of the processing chamber 102. A gate valve 136 is provided at the wafer loading/unloading port 134. For example, in the case of loading the wafer W, the gate valve 136 is opened and the wafer W is mounted on the mounting table 110 in the processing chamber 102 by a transfer mechanism such as a transfer arm (not shown) or the like. Then, the gate valve 136 is closed and the wafer W is processed.

The planar high frequency antenna 140 and a shield member 160 are provided at the ceiling portion of the processing chamber 102. The high frequency antenna 140 is disposed on the upper surface (outer surface) of the plate-shaped dielectric member 104. The shield member 160 covers the high frequency antenna 140. The high frequency antenna 140 includes the inner antenna element 142A and the outer antenna element 142B. The inner antenna element 142A is provided at the central portion of the plate-shaped dielectric member 104. The outer antenna element 142B is provided to surround the outer periphery of the inner antenna element 142A. The inner antenna element 142A and the outer antenna element 142B may be made of a conductor such as copper, aluminum, stainless steel, or the like. The inner antenna element 142A and the outer antenna element 142B may have, e.g., a spiral coil shape.

Figure 11:
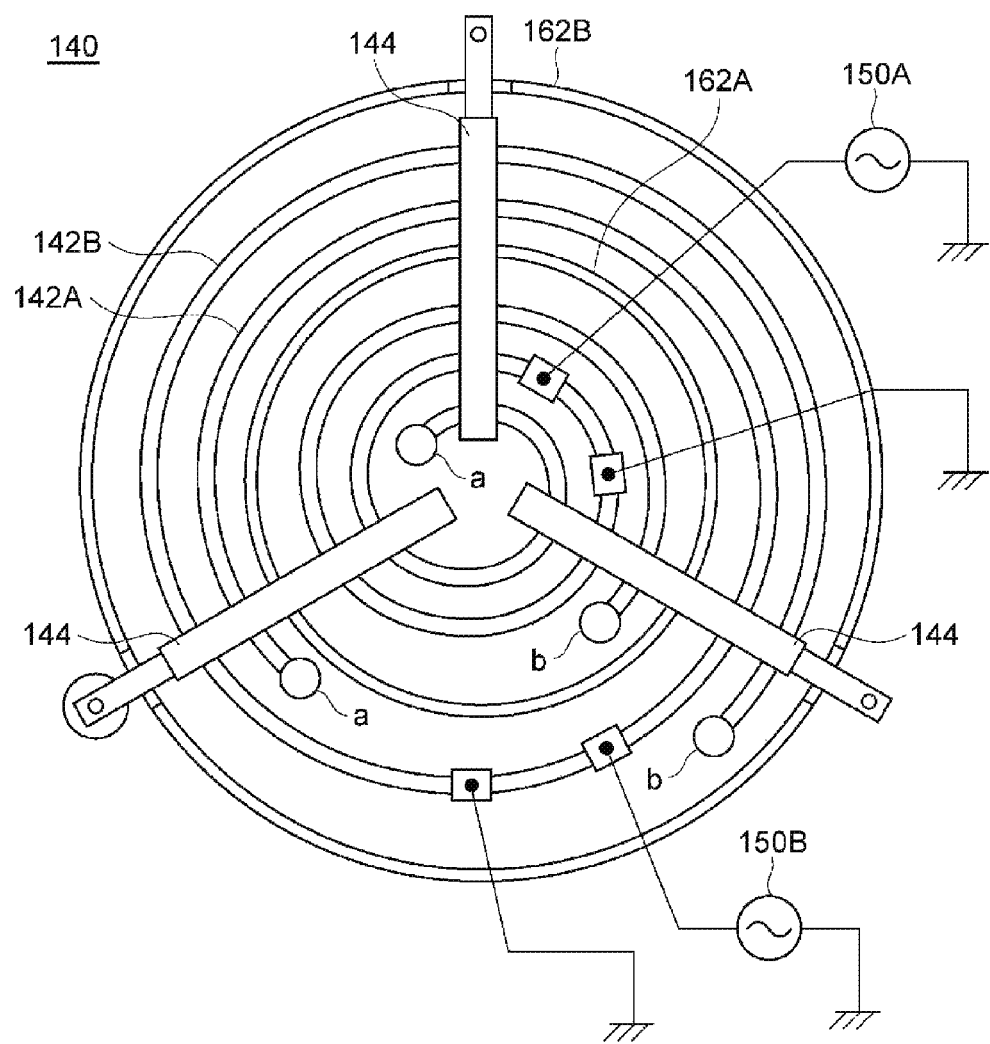
FIG. 11 shows a high frequency antenna shown in FIG. 10.

Both of the inner antenna element 142A and the outer antenna element 142B are clamped by a plurality of clamping bodies 144. Accordingly, the inner antenna element 142A and the outer antenna element 142B can be provided as one unit. The clamping bodies 144 have a rod shape as shown in FIG. 11, for example. The clamping bodies 144 may extend radially from the vicinity of the central portion of the inner antenna element 142A toward the outer side of the outer antenna element 142B. The inner antenna element 142A and the outer antenna element 142B shown in FIG. 11 are clamped by three clamping bodies 144, for example.

The shield member 160 includes a cylindrical inner shield wall 162A and a cylindrical outer shield wall 162B. As shown in FIG. 10, the inner shield wall 162A is provided between the inner antenna element 142A and the outer antenna element 142B to surround the inner antenna element 142A. The outer shield wall 162B is provided to surround the outer antenna element 142B. Accordingly, the upper surface of the plate-shaped dielectric member 104 is divided into a central portion (central zone) and a peripheral portion (peripheral zone). The central portion of the upper surface of the plate-shaped dielectric member 104 is disposed at the inner side of the inner shield wall 162A. The peripheral portion of the upper surface of the plate-shaped dielectric member 104 is disposed between the inner shield wall 162A and the outer shield wall 162B.

A disc-shaped inner shield plate 164A is provided on the inner antenna element 142A. The inner shield plate 164A is provided to block the opening of the inner shield wall 162A. A donut plate-shaped outer shield plate 164B is provided on the outer antenna element 142B. The outer shield plate 164B is provided to block the opening between the inner shield wall 162A and the outer shield wall 162B.

The shape of the shield member 160 is not limited to the cylindrical shape, and may be another shape such as a prismatic shape, or the like. However, it is preferable to match the shape of the shield member 160 to the shape of the processing chamber 102. Here, since the processing chamber 102 has a substantially cylindrical shape, the shield member 160 is also formed in a substantially cylindrical shape. If the processing chamber 102 has a substantially prismatic shape, it is preferable to form the shield member 160 in a substantially prismatic shape.

The high frequency power supply 150A and the high frequency power supply 150B are connected to the inner antenna element 142A and the outer antenna element 142B, respectively. Therefore, the high frequency power of the same frequency or different frequencies can be applied to the inner antenna element 142A and the outer antenna element 142B.

For example, when the high frequency power of a predetermined frequency (e.g., 40 MHz) is supplied from the high frequency power supply 150A to the inner antenna element 142A, the processing gas introduced into the processing chamber 102 is excited by the induced magnetic field generated in the processing chamber 102, and donut-shaped plasma is generated on the central portion of the wafer W.

When the high frequency power of a predetermined frequency (e.g., 60 MHz) is supplied from the high frequency power supply 150B to the outer antenna element 142B, the processing gas introduced into the processing chamber 102 is excited by the induced magnetic field generated in the processing chamber 102, and another donut-shaped plasma is generated on the peripheral portion of the wafer W.

The predetermined plasma processing, e.g., asking, etching, film formation, or the like, is performed on the wafer W by using the plasma thus generated. The frequencies of the high frequency power outputted from the high frequency power supply 150A and the high frequency power supply 150B are not limited to the above-described frequencies. The high frequencies of the high frequency power outputted from the high frequency power supply 150A and the high frequency power supply 150B may be, e.g., 13.56 MHz, 27 MHz, 40 MHz, 60 MHz, or the like. However, it is necessary to adjust the electrical lengths of the inner antenna element 142A and the outer antenna element 142B depending on the high frequencies of the high frequency power outputted from the high frequency power supply 150A and the high frequency power supply 150B.

The height of the inner shield plate 164A and the height of the outer shield plate 164B can be adjusted by an actuator 168A and an actuator 168B, respectively.

A controller 200 is connected to the plasma processing apparatus 100. The control unit 200 controls the operations of the respective components of the plasma processing apparatus 100. The control unit 200 is connected to a keyboard and a manipulation unit 210. An operator inputs commands and the like through the keyboard to manage the plasma processing apparatus 100. The manipulation unit 210 has a display and the like. The display visualizes and displays the operation status of the plasma processing apparatus 100.

A storage unit 220 is connected to the control unit 200. The storage unit 220 stores programs, recipe data, and the like. The program is a computer program that can realize various processes executed in the plasma processing apparatus 100 under the control of the control unit 200. The recipe data is required to execute the program.

The recipe data includes a recipe for performing a required process such as a cleaning process in the processing chamber 102 or the like as well as a plurality of processing recipes for processing the wafer W. These recipes include control parameters for controlling the respective components of the plasma processing apparatus 100 and a plurality of parameter values such as setting parameters and the like.

The processing recipe has parameter values such as a flow rate ratio of the processing gas, a pressure in the processing chamber 102, the high frequency power applied to the inner antenna element 142A and the outer antenna element 142B and the frequency thereof, and the like.

These recipes may be stored in a hard disk or a semiconductor memory, or may be set in a predetermined position of the storage unit 220 while being stored in a storage medium that is readable by a portable computer such as a CD-ROM, a DVD or the like. The control unit 200 reads out a desired processing recipe from the storage unit 220 based on an instruction from the manipulation unit 210 or the like and controls the respective components of the plasma processing apparatus 100 to perform a desired process in the plasma processing apparatus 100.

The control unit 200 and various configurations such as the manipulation unit 210 and the storage unit 220 connected to the control unit 200 can be included in the control unit Cnt.

A specific configuration of the high frequency antenna 140 will be described with reference to the drawings. As shown in FIG. 11, the high frequency antenna 140 includes the inner antenna element 142A and the outer antenna element 142B. Both ends of the inner antenna element 142A and the outer antenna element 142B are defined as free ends "a" and "b." Each of the inner antenna element 142A and the outer antenna element 142B is configured to form a standing wave of ½ wavelength with a longitudinal central portion (at or near the central point) in the winding direction as the ground point (ground).

In other words, the length, the winding diameter, the winding pitch, and the number of turns of the inner antenna element 142A are set such that the inner antenna element 142A resonates (resonates in a half-wave mode) at a wavelength that is one half of a wavelength of a predetermined reference frequency supplied from the high frequency power supply 150A. The reference frequency in the inner antenna element 142A may be, e.g., 40 MHz. For example, the electrical length of the inner antenna element 142A is a length that resonates at a wavelength that is one half of the wavelength of the reference frequency, i.e., a length that is one half of one wavelength at the reference frequency.

The length, the winding diameter, the winding pitch, and the number of turns of the outer antenna element 142B are set such that the outer antenna element 142B resonates (resonates in a half-wave mode) at a wavelength that is one half of a wavelength of a predetermined reference frequency supplied from the high frequency power supply 150B. The reference frequency in the outer antenna element 142B may be, e.g., 60 MHz. For example, the electrical length of the outer antenna element 142B is a length that resonates at a wavelength that is one half of the wavelength of the reference frequency, i.e., a length that is one half of one wavelength at the reference frequency.

The inner antenna element 142A and the outer antenna element 142B may have a pipe shape, a line shape, a plate shape, or the like. When the inner antenna element 142A and the outer antenna element 142B have the same winding pitch, one having a larger interconductor distance is advantageous in that a withstand voltage can be increased. Therefore, in view of the withstand voltage, it is preferable to form the inner antenna element 142A and the outer antenna element 142B in a thin plate shape rather than a thick pipe shape to obtain a larger interconductor distance. Even when it is desired to reduce the winding pitch of the inner antenna element 142A and the outer antenna element 142B, it is preferable to form the inner antenna element 142A and the outer antenna element 142B in a plate shape in view of the withstanding voltage.

In that case, the power feed points for supplying the high frequency power from the high frequency power supply 150A and the high frequency power supply 150B may be disposed at the inner or the outer side of the ground point. For example, the power feed points are preferably disposed at points where the impedance is 50Ω. The power feed points are variable. In that case, the power feed points may be automatically changed by a motor or the like.

Figure 12:
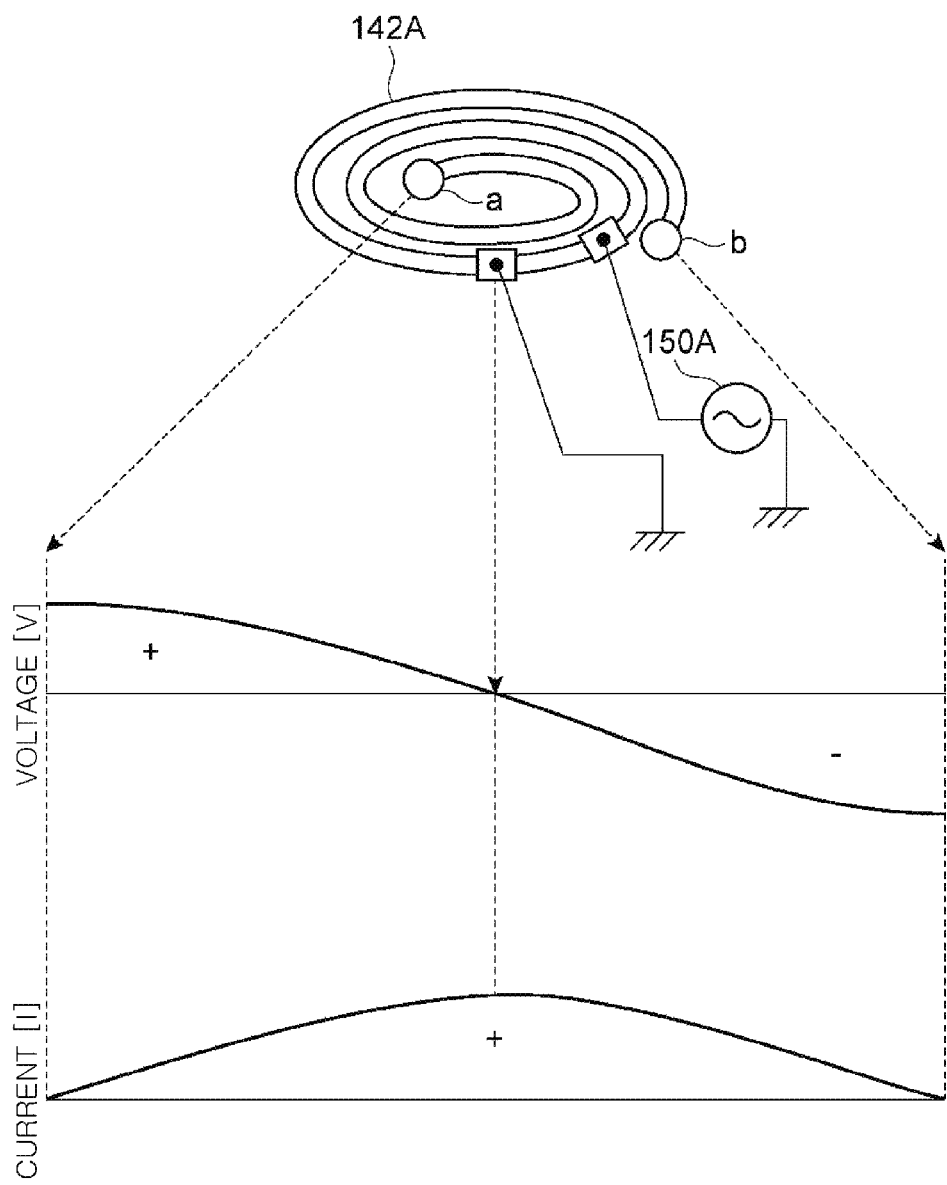
FIGS. 12 and 13 explain an operation of an antenna element shown in FIG. 10.
Figure 13:
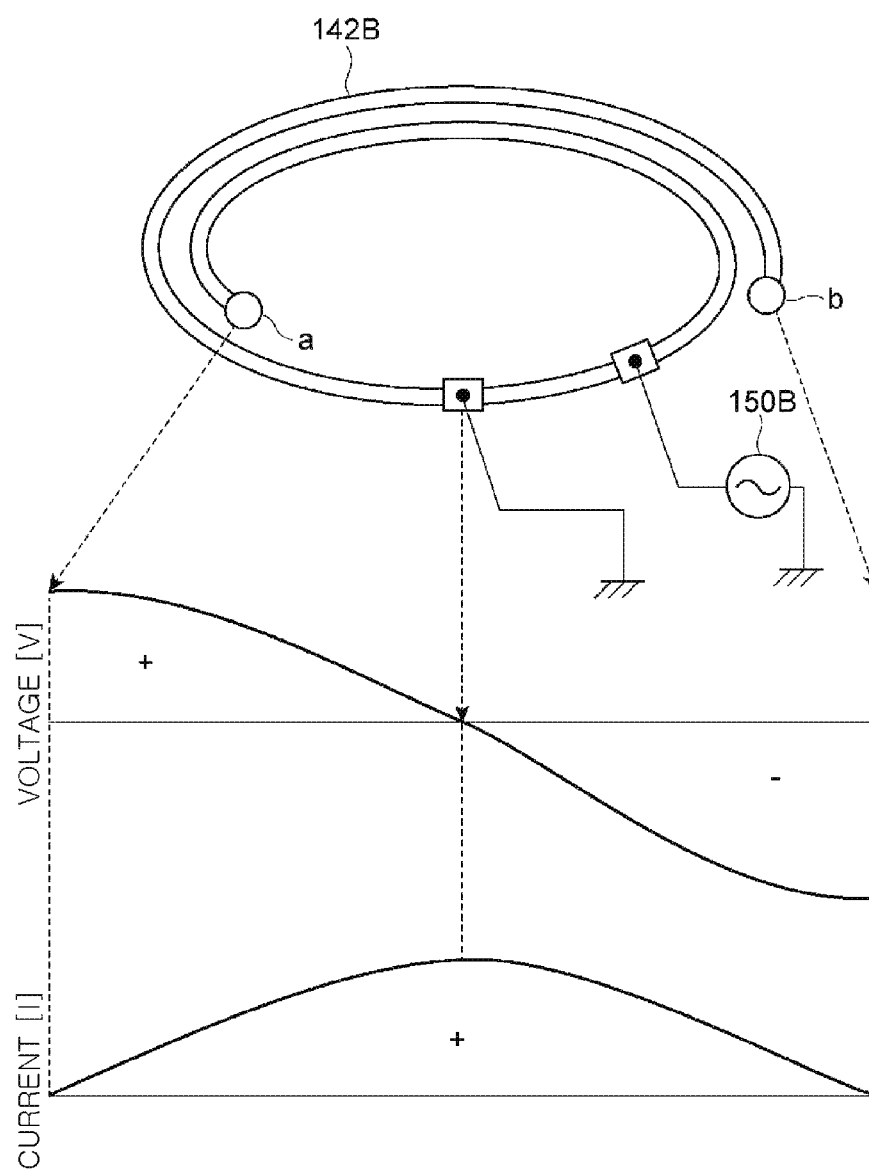

The effect of the high frequency antenna 140 will be described below. The inner antenna element 142A and the outer antenna element 142B resonate in a half-wave mode by applying the high frequency power of the reference frequency from the high frequency power supply 150A and the high frequency power supply 150B to the inner antenna element 142A and the outer antenna element 142B, respectively. As shown in FIGS. 12 and 13, at a certain moment, waveforms in which voltages V applied to the inner antenna element 142A and the outer antenna element 142B become zero at the central portion (ground point) and have positive peaks and negative peaks at one ends and the other ends are obtained. On the other hand, waveforms of currents I applied to the inner antenna element 142A and the outer antenna element 142B are shifted by 90° from the voltage waveforms. Therefore, the waveforms in which the currents I become maximum at the central portion (ground point) and zero at both ends are obtained.

Figure 14:
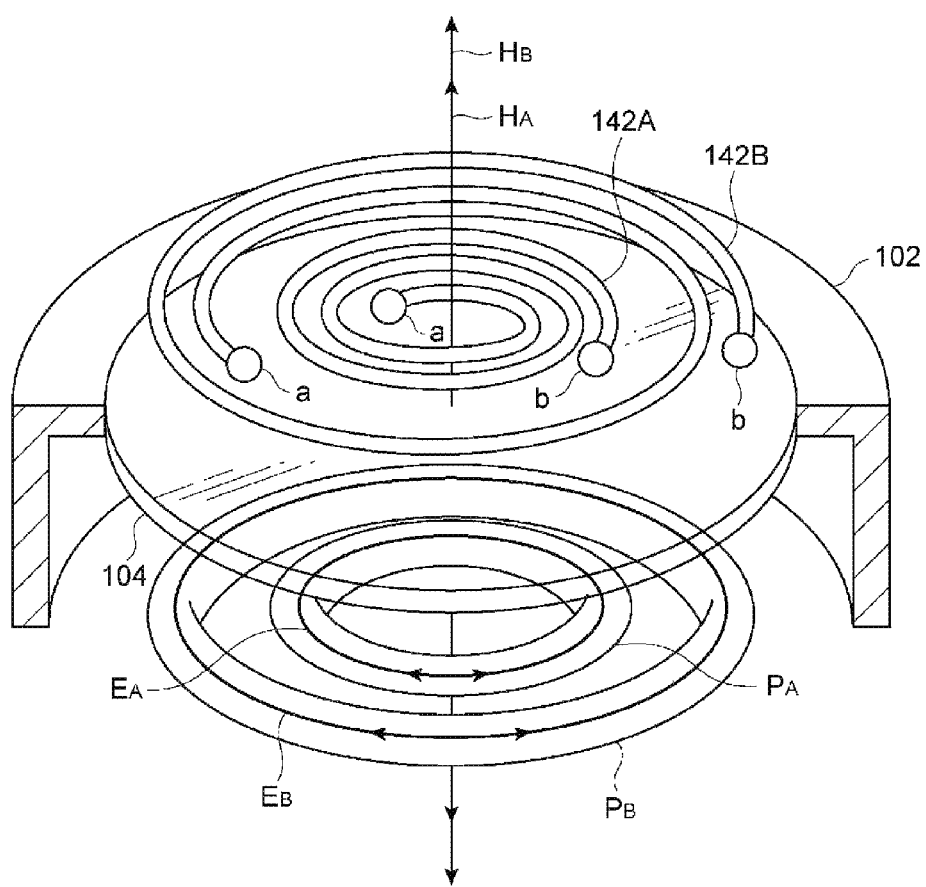
FIG. 14 explains an effect of the antenna element shown in FIG. 10.

Due to such standing waves, vertical magnetic fields $H_A$ and $H_B$ having maximum strengths at the substantially central portions of the spiral coil forming the inner antenna element 142A and the outer antenna element 142B are generated as shown in FIG. 14. Therefore, in the processing chamber 102, circular electric fields $E_A$ and $E_B$ centered on the vertical magnetic fields $H_A$ and $H_B$ are excited in substantially the same plane. Accordingly, donut-shaped plasmas $P_A$ and $P_B$ are generated near the positions below the ground points of the inner antenna element 142A and the outer antenna element 142B. Since the average voltage applied to the inner antenna element 142A and the outer antenna element 142B is very small, the capacitive coupling degree is extremely low, which makes it possible to generate plasma having a low potential.

The configuration of the microwave plasma processing apparatus 11 will be described with reference to FIGS. 15 and 16. The microwave plasma processing apparatus 11 is an example of a processing module 10b in which the second step is performed. The second step indicates any one of the steps ST1b2, step ST2b2, ST3b2, ST3b4, and ST4b2.

Figure 15:
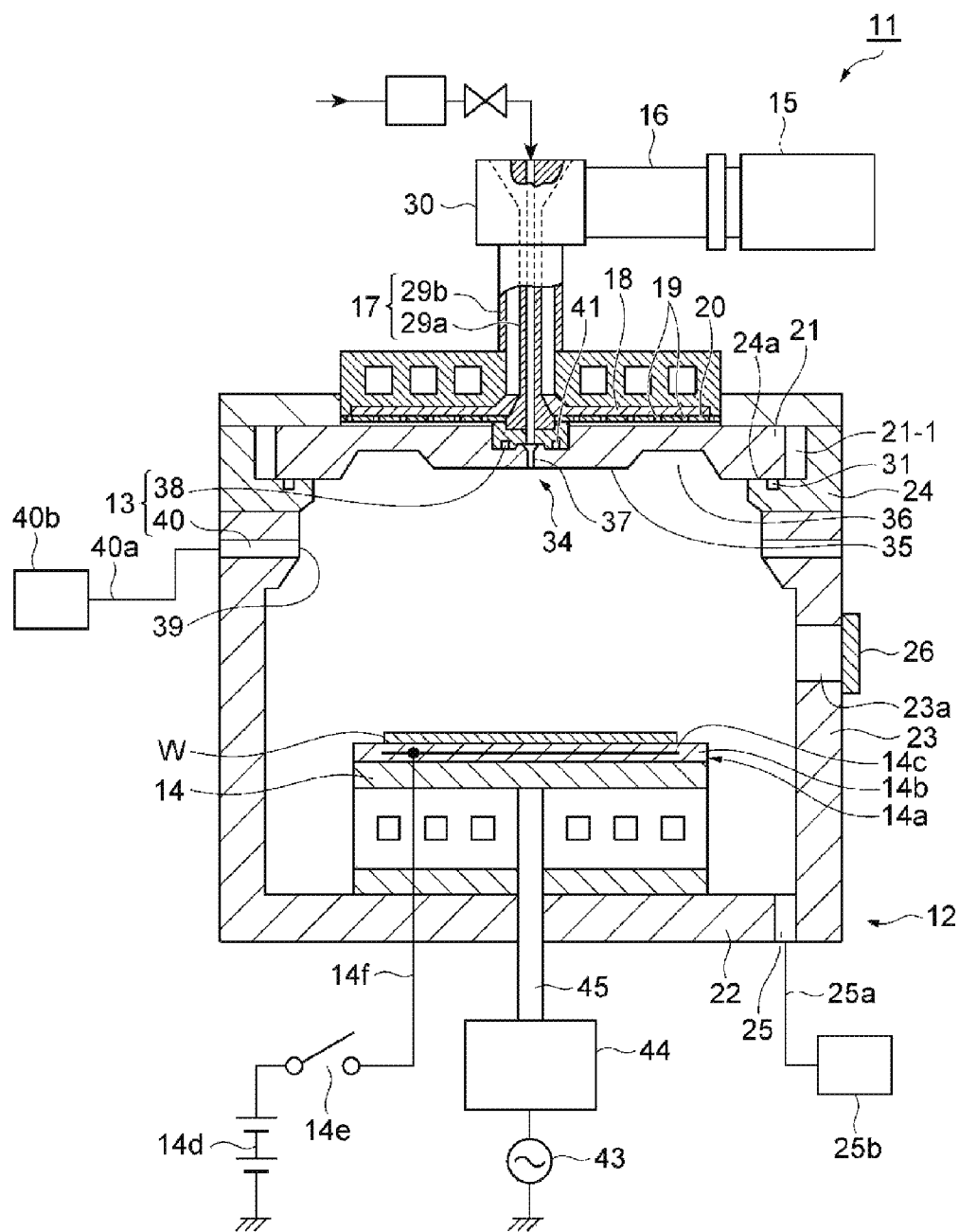
FIG. 15 shows an example of a specific configuration of a processing module for performing surface treatment on a wafer by using hydrogen radicals.
Figure 16:
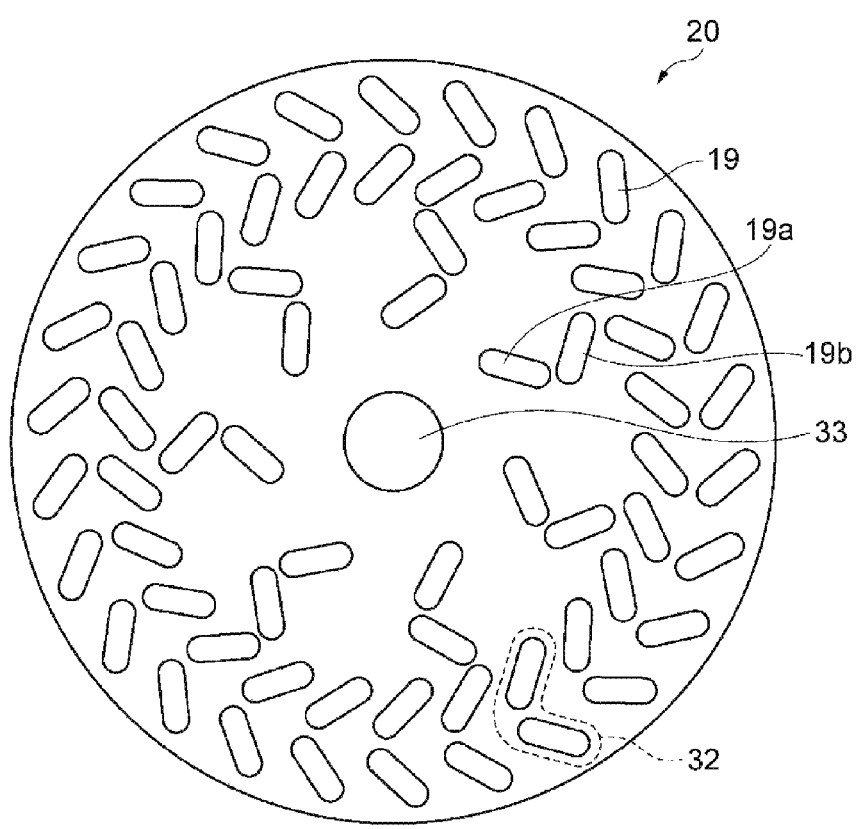
FIG. 16 shows a configuration of a slot antenna plate shown in FIG. 15.

As shown in FIGS. 15 and 16, the microwave plasma processing apparatus 11 is a plasma processing apparatus using a microwave as a plasma source. The microwave plasma processing apparatus 11 includes a processing chamber 12, a gas supply mechanism 13, a holding table 14, a microwave generator 15, a waveguide 16, a coaxial waveguide 17, a wave retardation plate 18, a slot antenna plate 20, a dielectric window 21, and a control unit (may be included in the control unit Cnt).

The processing chamber 12 has a processing space for performing plasma processing on the wafer W. The gas supply mechanism 13 supplies a processing gas for plasma processing or the like into the processing chamber 12. The holding table 14 is provided in the processing chamber 12 to hold the wafer W. The microwave generator 15 is connected to the outside of the processing chamber 12 and generates microwaves for plasma excitation.

The waveguide 16 and the coaxial waveguide 17 introduce the microwaves generated by the microwave generator 15 into the processing chamber 12. The wave retardation plate 18 is connected to the lower end portion of the coaxial waveguide 17 and has a dielectric member that propagates the microwaves introduced from the coaxial waveguide 17 in a diametric direction. The slot antenna plate 20 is disposed below the wave retardation plate 18 and has a plurality of slots 19 that radiates microwaves propagated by the wave retardation plate 18. The dielectric window 21 is disposed below the slot antenna plate 20 and transmits the microwaves radiated from the slots 19 into the processing chamber 12.

The control unit controls the entire microwave plasma processing apparatus 11. The control unit controls processing conditions for performing plasma processing on the wafer W, such as a gas flow rate in the gas supply mechanism 13, a pressure in the processing chamber 12, and the like.

The processing chamber 12 is configured to accommodate the wafer W. The processing chamber 12 includes a bottom portion 22 positioned below the holding table 14 and a sidewall 23 extending upward from the outer periphery of the bottom portion 22. The sidewall 23 has a cylindrical shape. A gas exhaust hole 25 is provided at the bottom portion 22 of the processing chamber 12. A gas exhaust unit 25b is connected to the gas exhaust hole 25 through a gas exhaust line 25a. The gas exhaust unit 25b includes a vacuum pump such as a turbo molecular pump or the like. The processing chamber 12 can be depressurized to a desired vacuum level by the gas exhaust unit 25b.

The upper end portion of the sidewall 23 forms an opening. A supporting member 24 for supporting the dielectric window 21 is provided at the upper end portion of the sidewall 23. The supporting member 24 forms a part of the upper end portion of the sidewall 23. A recess 24a for accommodating the outer peripheral surface of the dielectric window 21 is formed at the inner peripheral side of the supporting member 24.

The supporting member 24 is airtightly attached to the processing chamber 12 to block the opening of the upper end portion of the sidewall 23 in a state where the outer peripheral surface of the dielectric window 21 is accommodated in the recess 24a of the supporting member 24. A gap 21-1 is formed between the outer peripheral surface of the dielectric window 21 and the surface of the recess 24a of the support member 24 which faces the outer peripheral surface of the dielectric window 21.

An O-ring 31 is provided between the dielectric window 21 and the recess 24a of the supporting member 24. The dielectric window 21 is accommodated and supported in the recess 24a of the supporting member 24 via the O-ring 31. The processing chamber 12 is sealed by the dielectric window 21 and the O-ring 31.

An opening 23a is formed at the sidewall 23. A gate valve 26 for opening and closing the opening 23a is provided at the opening 23a. In the microwave plasma processing apparatus 11, the gate valve 26 is opened to transfer the wafer W.

The holding table 14 mounts and holds the disc-shaped wafer W thereon. An RF (Radio Frequency) bias high frequency power supply 43 is electrically connected to the holding table 14 via a matching unit 44 and a power supply rod 45. The bias high frequency power supply 43 outputs a high frequency power of a predetermined frequency, e.g., 13.56 MHz, suitable for controlling the energy of ions to be attracted to the wafer W at a predetermined power level to be described later. The matching unit 44 includes a matching device for matching the impedance of the bias high frequency power supply 43 side and the impedance of the load that is mainly the electrode, the plasma, and the processing container 12. The matching device includes a blocking capacitor for self-bias generation.

An electrostatic chuck 14a is provided on the upper surface of the holding base 14. The electrostatic chuck 14a holds the wafer W by electrostatic attractive force. The electrostatic chuck 14a includes an insulating film 14b and an electrode 14c. The electrode 14c is made of a conductive film and is embedded in the insulating film 14b. A DC power supply 14d is electrically connected to the electrode 14c via a switch 14e and a coated wire 14f. The electrostatic chuck 14a can attract and hold the wafer W by using Coulomb force generated by the DC voltage applied from the DC power supply 14d.

The microwave generator 15 is connected to the upstream side of the waveguide 16 for introducing the microwave via the coaxial waveguide 17 including a central conductor 29a and an outer peripheral conductor 29b and the mode transducer 30. The central conductor 29a and the outer peripheral conductor 29b of the coaxial waveguide 17 are formed in a cylindrical shape and are coaxially aligned so that a gap between the outer diameter surface of the central conductor 29a and the inner diameter surface of the outer peripheral conductor 29b extends in a vertical direction in FIG. 15.

The slot antenna plate 20 is a thin disc-shaped plate made of a copper material plated with nickel. Both surfaces in the thickness direction of the slot antenna plate 20 are flat. The slot antenna plate 20 is provided with a plurality of slots 19 penetrating in the plate thickness direction. The slot 19 includes a pair of adjacent slots, i.e., a first slot 19a elongated in one direction and a second slot 19b elongated in a direction orthogonal to the first slot 19a. Specifically, the pair of adjacent slots (the first slot 19a and the second slot 19b) is arranged so as to have a substantially chevron shape. In other words, the slot antenna plate 20 is provided with slot pairs 32, each including the first slot 19a extending in one direction and the second slot 19b extending in a direction perpendicular to one direction. An example of the slot pair 32 is illustrated as a region indicated by a dotted line in FIG. 16. A through-hole 33 is provided in the radial center of the slot antenna plate 20. The slot antenna plate 20 has rotational symmetry with respect to the radial center thereof.

The dielectric window 21 has a substantially disc shape and has a predetermined plate thickness. The dielectric window 21 is made of a dielectric material such as quartz, alumina, or the like. The dielectric window 21 is disposed on the supporting member 24 of the processing chamber 12 and fixed by a fixing member (not shown) together with the slot antenna plate 20. A through-hole 34 penetrating in a thickness direction, i.e., in an up and down direction in FIG. 15, is provided in the radial center of the dielectric window 21. The through-hole 34 is formed such that the diameter of the upper region becomes greater than the diameter of the lower region.

At a radially outer region of the bottom surface 35 of the dielectric window 21 attached to the microwave plasma processing apparatus 11 which faces a plasma generation space, a dielectric window recess 36 extending in an annular shape is recessed in a tapered shape inwardly in the plate thickness direction of the dielectric window 21 (the up direction in FIG. 15). A plurality of dimple-shaped grooves may be formed at the inner side of the dielectric window recess 36.

A processing gas for plasma processing is supplied into the processing chamber 12 by the gas supply mechanism 13.

In the microwave plasma processing apparatus 11, the control unit sets the temperature of the wafer W to a temperature suitable for the processing, e.g., within a range from −20° C. to 250° C. The microwaves generated by the microwave generator 15 propagate to the wave retardation plate 18 through the coaxial waveguide 17 and is radiated from the slots 19 provided in the slot antenna plate 20 to the dielectric window 21.

The microwaves transmitted through the dielectric window 21 cause an electric field directly below the dielectric window 21 to generate plasma in the processing chamber 12. The plasma generated directly below the dielectric window 21 is diffused in a direction away from the dielectric window 21, i.e., toward the holding table 14. Due to the diffused plasma, a plasma diffusion region is formed in a region including the wafer W mounted on the holding table 14.

The plasma processing such as plasma etching or the like is performed on the wafer W. The microwave plasma used for processing in the microwave plasma processing apparatus 11 has a relatively low electron temperature of, e.g., about 1.0 eV. Therefore, plasma damage to the wafer W can be reduced. The above-described antenna including the slot antenna plate 20 and the wave retardation plate 18 is an example of the radial line slot antenna.

The configuration of the gas supply mechanism 13 for supplying the processing gas for plasma processing into the processing chamber 12 will be described. The gas supply mechanism 13 includes an injector 38 and an outer gas flow path 40. The injector 38 is a central gas supply member disposed at the central portion of the processing chamber 12 and has a gas supply port 37 for supplying a processing gas toward the central region of the wafer W. The outer gas flow path 40 has a gas supply port 39 for injecting the processing gas toward a radially inner side from a peripheral region different from the central region of the wafer W.

In the central gas supply member, the hollow portion of the central conductor 29a of the coaxial waveguide 17 is used as a gas supply path. The injector 38 is provided at the inner side of the dielectric window 21. Specifically, the lower region of the through-hole 34 formed in the dielectric window 21 which has a smaller diameter serves as the gas supply port 37 of the injector 38, and the upper region of the through-hole 34 which has a larger diameter serves as an accommodating recess 41 for mounting and accommodating a main body of the injector 38.

The outer gas flow path 40 is formed at the sidewall 23 of the processing chamber 12. The outer gas flow path 40 is connected to the outer gas supply source 40b through a conduit 40a. The outer gas supply source 40b supplies a predetermined processing gas for processing the wafer W to the conduit 40a.

The injector 38 and the outer gas flow path 40 supply a processing gas for plasma processing or the like from the outside of the processing container 12 into the processing chamber 12. In other words, the processing gas supplied into the processing chamber 12 is supplied to the central region of the wafer W by the injector 38 and to the peripheral region of the wafer W by the outer gas flow path 40. The control unit can control types of processing gases supplied from the injector 38 and the outer gas flow path 40 or the flow rate ratio of the processing gases.

From the foregoing, it will be appreciated that various embodiments of the present disclosure have been described herein for purposes of illustration and various changes can be made without departing from the scope and spirit of the present disclosure. Accordingly, various embodiments described herein are not intended to be limiting, and the true scope and spirit are indicated by the following claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A processing method for processing a target object, comprising:
    a first step of performing etching on the target object;
    a second step of performing surface treatment on the target object; and
    a third step of performing a deposition process on the target object,
    wherein the target object is not exposed to an atmosphere from an end of the first step to a start of the third step, and an oxygen partial pressure around the target object is adjusted to 127 Pa or less and a water vapor partial pressure around the target object is adjusted to 24.1 Pa or less by vacuum evacuation of a vacuum pump or by inert gas substitution,
    in the second step, the surface treatment is performed by using hydrogen radicals generated by a high frequency antenna,
    the high frequency antenna is formed in a shape of a planar spiral coil for generating an inductively coupled plasma, and
    an antenna element of the high frequency antenna is opened at both ends and grounded at a central portion, and resonates at a wavelength that is one half of a wavelength of a signal supplied from a high frequency power supply used in the processing method,
    wherein in the second step, the surface treatment is performed by alternately repeating a process of supplying hydrogen radicals around the target object at a first pressure and a step of stopping the supply of hydrogen radicals to a vicinity of the target object and setting a pressure around the target object to a second pressure lower than the first pressure.

2. The processing method of claim 1, wherein in the second step, the surface treatment using hydrogen radicals is performed to reduce a fluorine content on a surface of the target object to 1/10 or less of a fluorine content before the surface treatment.

3. The processing method of claim 1, wherein the first step, the second step, and the third step are executed in that order.

4. The processing method of claim 1, wherein between the first step, the second step, and the third step, at least one or both of a purge gas and a cryopump is used to control the oxygen partial pressure and the water vapor pressure around the target object.

5. The processing method of claim 4, wherein the purge gas includes an inert gas of an extremely low oxygen pressure of $10^{-19}$ Pa or less that is generated in a yttria-stabilized zirconia tube.

6. The processing method of claim 4, wherein the purge gas contains $H_2$ gas or CO gas.

* * * * *